(12) United States Patent
Scott

(10) Patent No.: US 6,845,118 B1
(45) Date of Patent: Jan. 18, 2005

(54) ENCAPSULATED OPTOELECTRONIC DEVICES WITH CONTROLLED PROPERTIES

(75) Inventor: Jeffrey W. Scott, Santa Barbara, CA (US)

(73) Assignee: Optical Communication Products, Inc., Woodland Hills, CA (US)

( * ) Notice: Subject to any disclaimer, the term of this patent is extended or adjusted under 35 U.S.C. 154(b) by 0 days.

(21) Appl. No.: 09/535,629

(22) Filed: Mar. 24, 2000

Related U.S. Application Data

(63) Continuation-in-part of application No. 09/237,580, filed on Jan. 25, 1999, now Pat. No. 6,160,834.
(60) Provisional application No. 60/125,916, filed on Mar. 24, 1999.

(51) Int. Cl.[7] .................................................. H01S 3/08
(52) U.S. Cl. ...................................... 372/96; 372/29.021
(58) Field of Search ................................. 372/103, 107, 372/29.014, 29.016, 38.06, 41, 47, 49, 54, 100, 12, 96, 46, 20, 99, 50, 45, 94, 75; 257/184, 714; 358/2, 39, 154; 361/767; 445/24; 359/154, 811; 369/112.14; 385/94

(56) References Cited

U.S. PATENT DOCUMENTS

| | | | |
|---|---|---|---|
| 4,510,607 A | | 4/1985 | Garcia et al. ................. 372/49 |
| 4,847,851 A | * | 7/1989 | Dixon ......................... 372/75 |
| 5,067,788 A | * | 11/1991 | Jannson et al. ............... 358/2 |
| 5,089,860 A | | 2/1992 | Deppe et al. ................. 357/16 |
| 5,115,441 A | * | 5/1992 | Kopf et al. ................... 372/45 |
| 5,136,152 A | * | 8/1992 | Lee ............................ 257/699 |
| 5,262,675 A | * | 11/1993 | Bausman, Jr. .............. 257/714 |
| 5,359,447 A | * | 10/1994 | Hahn et al. ................. 359/154 |
| 5,361,244 A | * | 11/1994 | Nakamura et al. ....... 369/44.23 |
| 5,425,043 A | * | 6/1995 | Holonyak, Jr. et al. ....... 372/50 |
| 5,432,812 A | * | 7/1995 | Kurobe et al. ................ 372/99 |
| 5,434,939 A | * | 7/1995 | Matsuda ..................... 385/88 |
| 5,577,064 A | * | 11/1996 | Swirhun et al. ............. 372/96 |

(List continued on next page.)

FOREIGN PATENT DOCUMENTS

| | | |
|---|---|---|
| JP | 57-164585 | 9/1982 |
| JP | 01-222492 | 5/1989 |

*Primary Examiner*—Minsun Oh Harvey
*Assistant Examiner*—Tuan N. Nguyen
(74) *Attorney, Agent, or Firm*—Barlow, Josephs & Holmes, Ltd.

(57) ABSTRACT

An optoelectronic device, such as a VCSEL, is disclosed whose transmission does not change upon encapsulation by a material such as plastic, epoxy or other suitable encapsulant with a known index of refraction. The surface reflection of the VCSEL surface is very different depending on whether it is terminated in air or the encapsulant, with a much larger reflection in the case of air. It is known that the surface reflection can be made out of phase with the rest of the mirror, effectively increasing the transmission. The amount of the transmission increase can be adjusted by controlling the thickness of the surface layer. Once the VCSEL is encapsulated, the surface reflection is reduced, and the transmission at the facet is increased but the dephased reflection is also reduced. Depositing a surface layer whose index of refraction is similar to the encapsulant, and adjusting the surface layer thickness correctly, the overall transmission from the laser into the terminating material is unchanged, be it air or encapsulation. As a result, the laser properties such as slope efficiency and threshold current are unchanged upon encapsulation. The same procedure may be applied to devices other than VCSELs such as other types of lasers, LEDs, and resonant cavity photodetectors to achieve encapsulated optoelectronic components with controlled properties that remain unchanged upon encapsulation.

28 Claims, 23 Drawing Sheets

U.S. PATENT DOCUMENTS

| | | | | |
|---|---|---|---|---|
| 5,615,052 A | * | 3/1997 | Doggett | 359/811 |
| 5,710,753 A | * | 1/1998 | Brazas, Jr. | 369/112.12 |
| 5,812,582 A | * | 9/1998 | Gilliland et al. | 372/50 |
| 5,953,355 A | * | 9/1999 | Kiely et al. | 372/43 |
| 5,955,839 A | * | 9/1999 | Jaffe et al. | 313/578 |
| 6,069,905 A | * | 5/2000 | Davis et al. | 372/43 |
| 6,160,834 A | * | 12/2000 | Scott | 372/96 |
| 6,246,123 B1 | * | 6/2001 | Landers et al. | 257/787 |
| 6,312,304 B1 | * | 11/2001 | Duthaler | 445/24 |
| 6,356,686 B1 | * | 3/2002 | Kuczynski | 385/39 |
| 6,392,256 B1 | * | 5/2002 | Scott et al. | 257/184 |
| 6,396,712 B1 | * | 5/2002 | Kuijk | 361/767 |
| 6,417,017 B1 | * | 7/2002 | Ih | 438/22 |
| 6,422,766 B1 | * | 7/2002 | Althaus et al. | 385/94 |
| 6,483,864 B1 | * | 11/2002 | Yuang et al. | 372/96 |
| 6,567,435 B1 | * | 5/2003 | Scott et al. | 372/29.021 |
| 6,670,599 B2 | * | 12/2003 | Wagner et al. | 250/214.1 |

* cited by examiner

| VCSEL STRUCTURE | OXIDE MEDIUM MATCH THICKNESS (A) | TRANSMISSION IN AIR (%) | TRANSMISSION IN PLASTIC (%) |
|---|---|---|---|
| 4 PERIODS + | 0 | 0.017 | 0.025 |
| 4 PERIODS + | 200 | 0.017 | 0.025 |
| 4 PERIODS + | 400 | 0.018 | 0.025 |
| 4 PERIODS + | 600 | 0.020 | 0.024 |
| 4 PERIODS + | 800 | 0.023 | 0.024 |
| 4 PERIODS + | 840 | 0.024 | 0.024 |
| 4 PERIODS + | 1000 | 0.027 | 0.024 |
| 4 PERIODS + | 1200 | 0.032 | 0.023 |
| 4 PERIODS + | 1400 | 0.034 | 0.023 |

FIG. 17

| TUNING LAYER THICKNESS (LAYER 8) | MEDIUM MATCH THICKNESS (LAYER 1) | TRANSMISSION IN AIR OR PLASTIC | LOSS | OPTICAL EFFICIENCY | SCALED |
|---|---|---|---|---|---|
| AS GROWN | NO MIRROR | 0.256 | 0.3 | 0.460 | 1 |
| 1062 | 840 | 0.024 | 0.3 | 0.074 | 0.161 |
| 850 | 1050 | 0.025 | 0.3 | 0.077 | 0.167 |
| 637 | 1300 | 0.029 | 0.3 | 0.088 | 0.191 |
| 425 | 1550 | 0.036 | 0.3 | 0.107 | 0.233 |
| 212 | 1930 | 0.042 | 0.3 | 0.123 | 0.267 |
| 0 | 2330 | 0.045 | 0.3 | 0.130 | 0.283 |

FIG. 19

ENCAPSULATED OPTOELECTRONIC DEVICES WITH CONTROLLED PROPERTIES

CROSS-REFERENCE TO RELATED APPLICATIONS

This application is a continuation-in-part of U.S. patent application Ser. No. 09/237,580, filed Jan. 25, 1999 now U.S. Pat. No. 6,160,834. This application further claims the benefit of U.S. patent application Ser. No. 09/531,442, entitled "VCSEL Power Monitoring System Using Plastic Encapsulation Techniques", filed Mar. 20, 2000, now U.S. Pat. No. 6,562,435, and U.S. Provisional Patent Application No. 60/125,916, filed Mar. 24, 1999. The contents of all of the preceding applications am hereby incorporated by reference.

FIELD OF THE INVENTION

The invention relates to the field of optical devices, and more particularly, to an apparatus and method for controlling the properties of optoelectronic components encapsulated by a material with an index of refraction substantially different from air.

BACKGROUND

Semiconductor lasers are widely used in applications such as optical communications. The edge emitting laser diode is a semiconductor laser that emits light from a plane which is a continuation of the p-n junction of the diode. Cleaved surfaces at the ends of the diode act as mirrors which together define an optical cavity. Optical feedback provided by the cleaved mirrors creates a resonance of the emitted light that results in lasing.

The vertical cavity surface emitting laser (VCSEL) is another type of semiconductor laser in which the optical cavity is normal to the p-n junction of the semiconductor wafer from which it was fabricated. Ordinarily VCSELs are manufactured with many layers of semiconductor material deposited upon the substrate. The VCSEL includes highly reflective optical mirrors above and below the active layer, which enable laser output normal to the surface of the wafer.

It has been observed that optoelectronic devices, such as VCSELs, light emitting diodes, resonant cavity photodetectors (RCD) and other devices, when encapsulated in a material with an index of refraction other than air, such as plastic or epoxy, exhibit properties that differ compared to the same device in air. The properties that change include the threshold current and slope efficiencies in the case of a laser or resonance depth and bandwidth in the case of an RCD. The reason for the change is that the index of refraction for air, or a vacuum, is 1 while the index of refraction for plastic or glass, for example, is approximately 1.5. The transmission from the top surface of the device is therefore changed when it is embedded in a different index, changing the device characteristics.

Generally, an advantage of the VCSEL and other surface-normal devices is that it can be tested and characterized while still part of the wafer. Such automated testing is very efficient, enabling characterization and screening of properties such as the resistance, slope efficiency and threshold current over the operating temperature range. If the facet transmission changes after encapsulation, however, the slope efficiency and threshold current will change, making the prior testing inaccurate. This change in properties upon encapsulation therefore requires additional testing or careful test correlation and control of the laser properties affecting the changes in performance with changing transmission upon encapsulation.

SUMMARY OF THE INVENTION

There is therefore provided in a presently preferred embodiment of the present invention a design for an optoelectronic device, such as a VCSEL, whose transmission does not change upon encapsulation by a material such as plastic, epoxy or other suitable encapsulant with a known index of refraction. The surface reflection of the VCSEL surface is very different depending on whether it is terminated in air or the encapsulant, with a much larger reflection in the case of air. It is known that the surface reflection can be made out of phase with the rest of the mirror, effectively increasing the transmission. The amount of the transmission increase can be adjusted by controlling the thickness of the surface layer. Once the VCSEL is encapsulated, the surface reflection is reduced, and the transmission at the facet is increased but the dephased reflection is also reduced. Depositing a surface layer (encapsulation medium-matching layer) whose index of refraction is similar to the encapsulant, and adjusting the surface layer thickness correctly, the overall transmission from the laser into the terminating material is unchanged, be it air or encapsulation. As a result, the laser properties such as slope efficiency and threshold current are unchanged upon capsulation. The same procedure may be applied to devices other than VCSELs such as other types of lasers, LEDs, and resonant cavity photodetectors to achieve encapsulated optoelectronic components with controlled properties that remain unchanged upon encapsulation.

BRIEF DESCRIPTION OF THE DRAWINGS

These and other features of the present invention will be better understood from the following detailed description read in light of the accompanying drawings, wherein:

FIG. 17 is a table illustrating how varying the oxide medium match thicknesses in a VCSEL affects the transmission of the VCSEL;

FIG. 19 is a table showing exemplary tuning layer calculations for an encapsulated device, which uses an oxide medium match to keep the transmission the same in both air and plastic, according to an alternate embodiment of the invention;

DETAILED DESCRIPTION OF THE INVENTION

Figure 21:
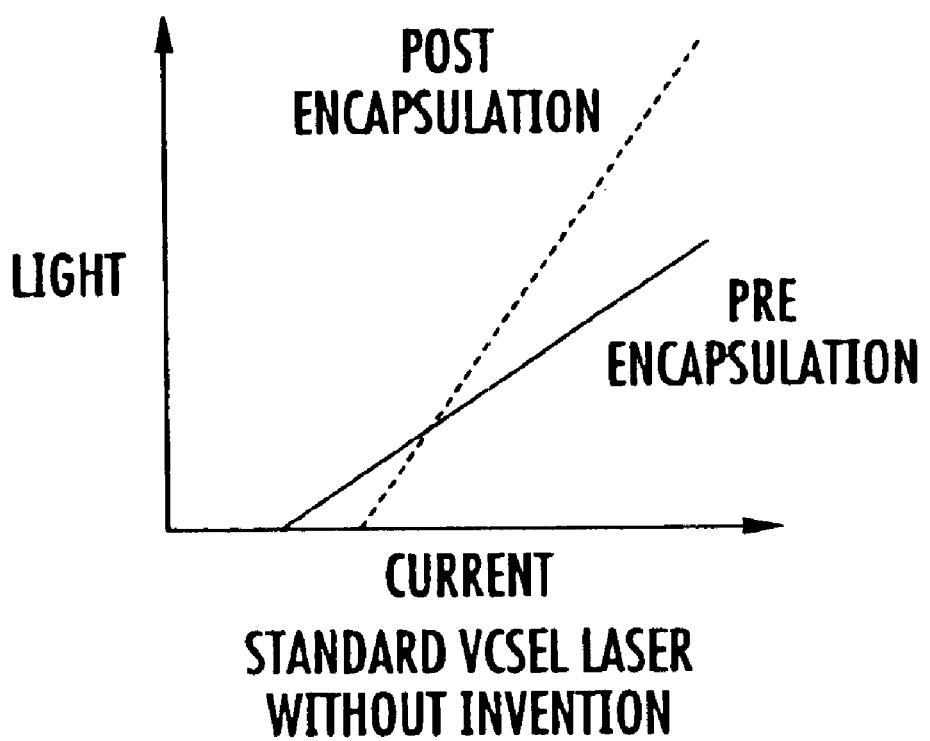
FIGS. 21 and 21A are qualitative graphical representations of the characteristics of two lasers pre and post encapsulation, wherein the plot in FIG. 21 is from a laser fabricated conventionally and the plot in FIG. 21A is from a laser fabricated according to the present invention.
Figure 21A:
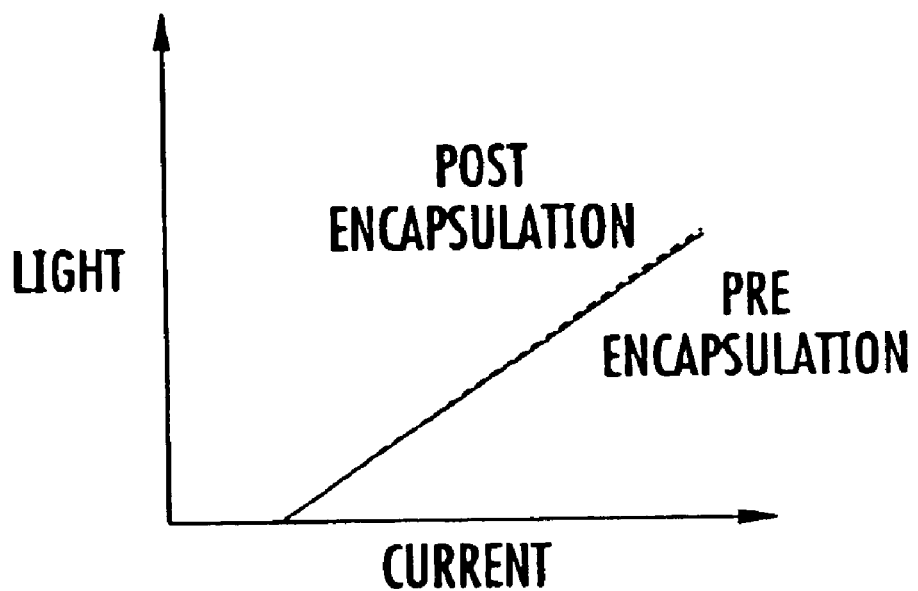

The present invention provides a design for an optoelectronic device such as a VCSEL whose transmission does not change upon encapsulation by a material such as plastic, epoxy or other suitable encapsulant with a known index of refraction. FIGS. 21 and 21A are qualitative graphical representations of the characteristics of two lasers pre and post encapsulation. The plot in FIG. 21 is from a laser fabricated conventionally illustrating how characteristics of the device change after encapsulation. The plot in FIG. 21A, made from a laser fabricated according to the present invention, illustrates how the characteristics of the device are controlled and remain substantially the same after encapsulation. In one embodiment of the invention, the optoelectronic device is a conventional VCSEL or a VCSEL with a variable tuning layer that enables growth of wafers of VCSELs with consistent properties. In the following description, the VCSEL with variable tuning layer is presented first, followed by various embodiments of encapsulated VCSELs, and finally VCSELs, with or without variable tuning layers, designed according to the teachings of the present invention to exhibit substantially the same properties both before and after encapsulation. Although the description focuses on VCSELs, it will be understood that the same teachings may be advantageously applied to other optoelectronic components, such as LEDs or resonant cavity photodetectors.

Figure 1:
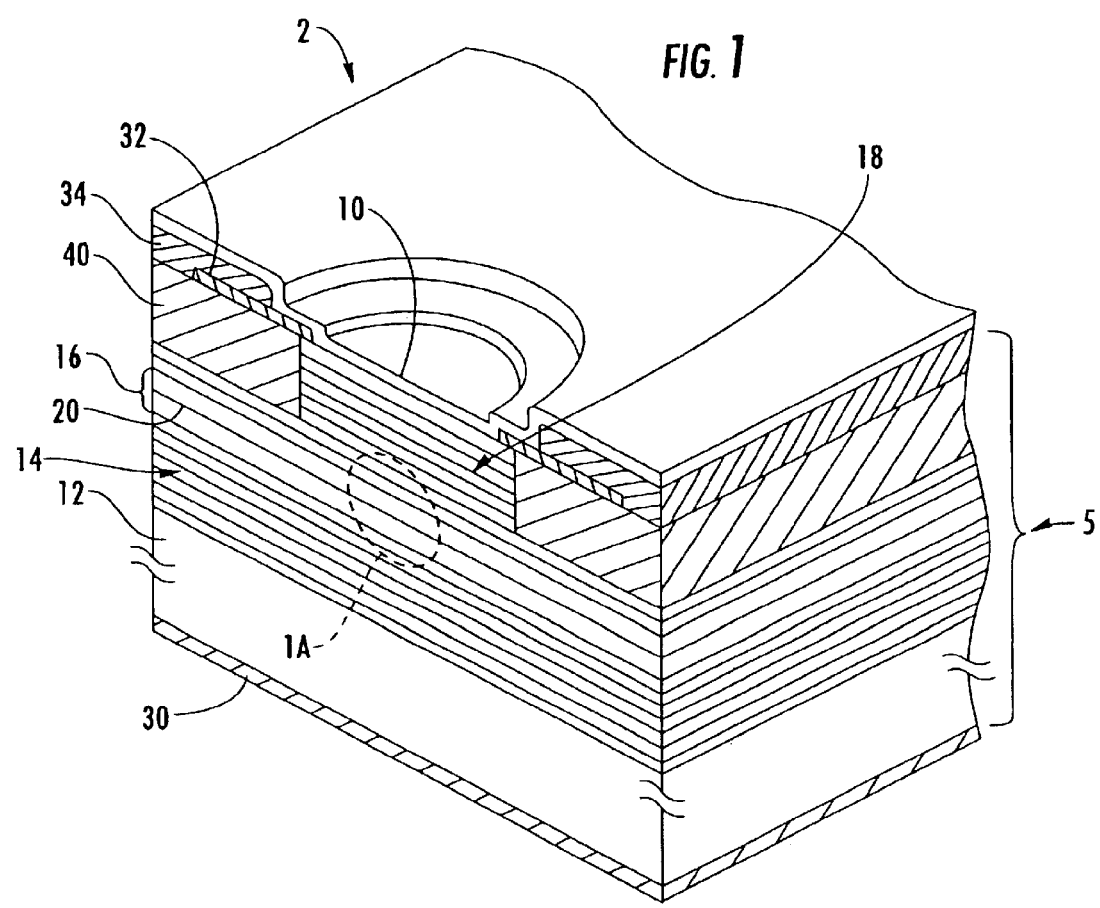
FIG. 1 is a perspective view, partly in cross section, of a VCSEL with variable tuning layer.

Referring to FIG. 1, a VCSEL 2 with variable tuning layer generally includes a conventional VCSEL portion 5 and a variable tuning layer 10 having a thickness predetermined in an intermediate process step to achieve a laser with a desired slope efficiency. Advantageously, the disclosed method can be used with virtually any conventional VCSEL design, an exemplary embodiment of which is described herein.

The exemplary conventional VCSEL portion 5 includes a substrate 12, a first or lower mirror 14, an optical cavity 16, and a second or upper mirror 18. The substrate 12 is made of gallium arsenide (GaAs) or any other suitable material. The first and second mirrors are comprised of multilayered distributed Bragg reflectors (DBRs), as is conventional in the art. In the exemplary embodiment, aluminum gallium arsenide (AlGaAs) with varying concentrations of aluminum and gallium are used to fabricate the mirrors. The optical thickness of each mirror layer is typically designed to be a quarter wavelength of the emitted light of the laser where the optical thickness is given by the product of the physical thickness and the index of refraction.

Figure 1A:
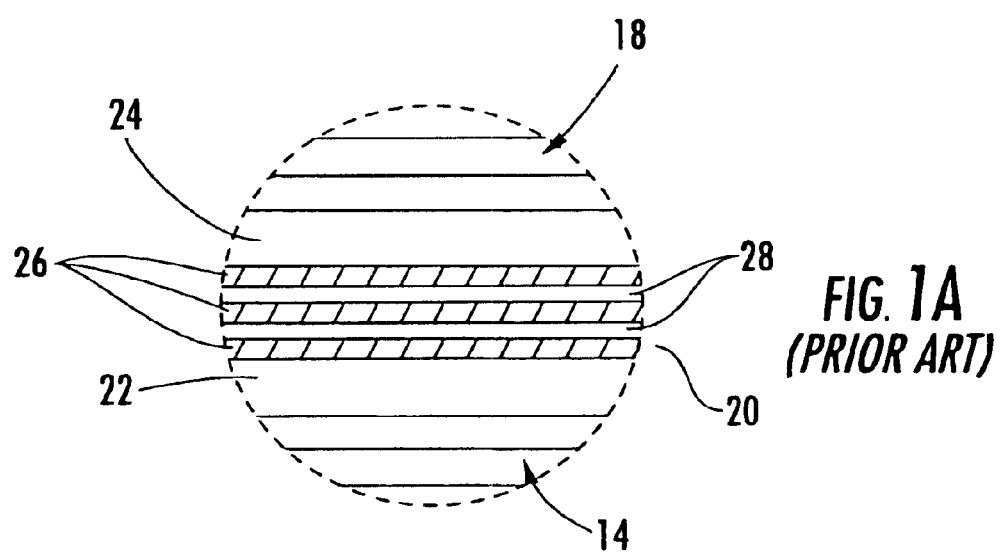
FIG. 1A is a cross sectional view of an exemplary active region of a conventional VCSEL portion of the VCSEL with variable tuning layer of FIG. 1.

The conventional optical cavity 16 (FIG. 1A) includes an active region 20 surrounded by first and second cladding regions 22, 24. The first and second cladding regions are made of AlGaAs in the exemplary embodiment. In the active region, three quantum wells 26 made of GaAs are disposed adjacent barrier layers 28 made of $Al_{0.25}Ga_{0.75}As$. As is generally understood, the number of and materials forming the quantum wells and surrounding barrier layers can be varied depending on the design.

The epitaxial structure is preferably formed into discrete lasers by a combination of current confinement and ohmic contacts. The contact metalization forming n-ohmic contact 30 on the bottom of the substrate may be, for example, eutectic gold germanium deposited by electron beam evaporation or sputtering. The top contact metalization forming p-ohmic contact 32 may be, for example, gold with 2% beryllium added or a layered structure of titanium/platinum/gold, preferably deposited by electron beam evaporation. Current constriction is preferably provided by using proton implantation region 40 to convert the upper mirror DBR 18 to high resistivity in all areas except the active device, isolating the devices into individual VCSELs while in wafer form. Other techniques for current constriction, such as selective AlGaAs oxidation, are also applicable. A probe pad metalization 34 is preferably disposed onto the p ohmic contact 32 to provide for wire bonding and electrical testing.

The variable tuning layer 10 is preferably disposed on the conventional VCSEL structure 5 to tune the slope efficiency and thereby compensate for manufacturing variations. The variable tuning layer may be made of any optically transparent, mechanically stable material. In a preferred embodiment, the variable tuning layer is formed of a dielectric layer of a silicon oxide or silicon nitride, whose thickness is chosen to center the slope efficiency distribution of the lasers on a wafer to compensate for wafer to wafer variation in the slope efficiency.

The thickness of the variable tuning layer 10 is preferably in the range from about zero to about one quarter wavelength, or multiples thereof, for yielding a final surface reflection that can be continuously varied from in phase to out of phase with the adjacent DBR. The term "surface reflection" is meant to have an ordinary meaning as known in the art, and is further meant to cover any reflections on surfaces (e.g., air, plastic, or a plurality of layers comprising an additional Bragg reflector), relating to a top layer and/or one or more intermediate layers. In practice, the phases of all reflections above the variable tuning layers are changed relative to the layers below the variable tuning layer. In the preferred embodiment, the tuning layer 10 has the effect of altering the top facet reflectivity of the VCSEL in a predictable manner, thereby adjusting the slope efficiency of the overall device, and enabling the production of a plurality of lasers having consistent slope characteristics from different wafers.

Figure 2:
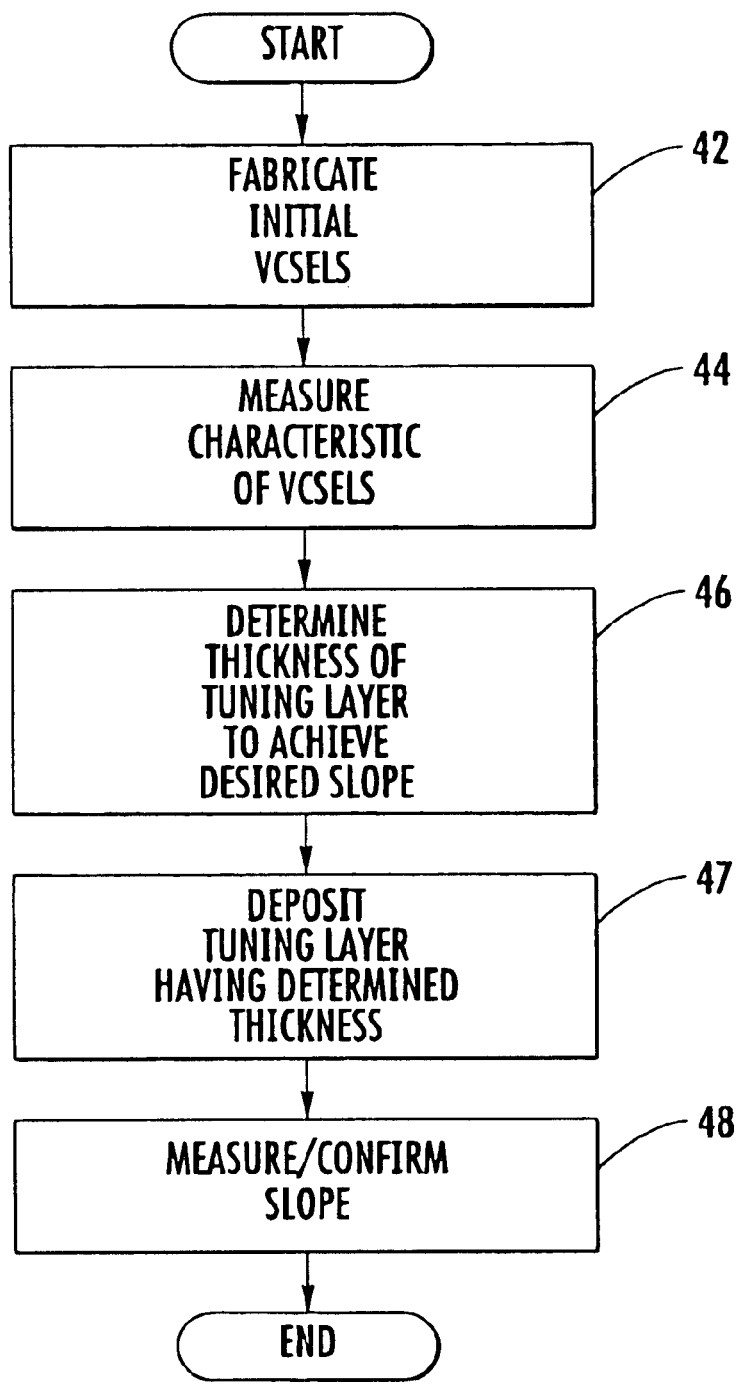
FIG. 2 is a flow diagram for a process of manufacturing the VCSEL with a variable tuning layer of FIG. 1.

Referring also to FIG. 2, the VCSEL 2 with variable tuning layer 10 is preferably manufactured according to a process that includes the steps of fabricating 42 the initial VCSEL portion; measuring 44 a characteristic of the initial VCSEL portion 5, such as its resistance or slope efficiency; determining 46 the thickness of the variable tuning layer 10 based on the measured characteristic necessary to change the slope of the laser to a desired value; and depositing 47 a variable tuning layer 10 having the determined thickness to produce a laser with the desired slope. Each of the steps is described in more detail hereinafter.

Figure 3:
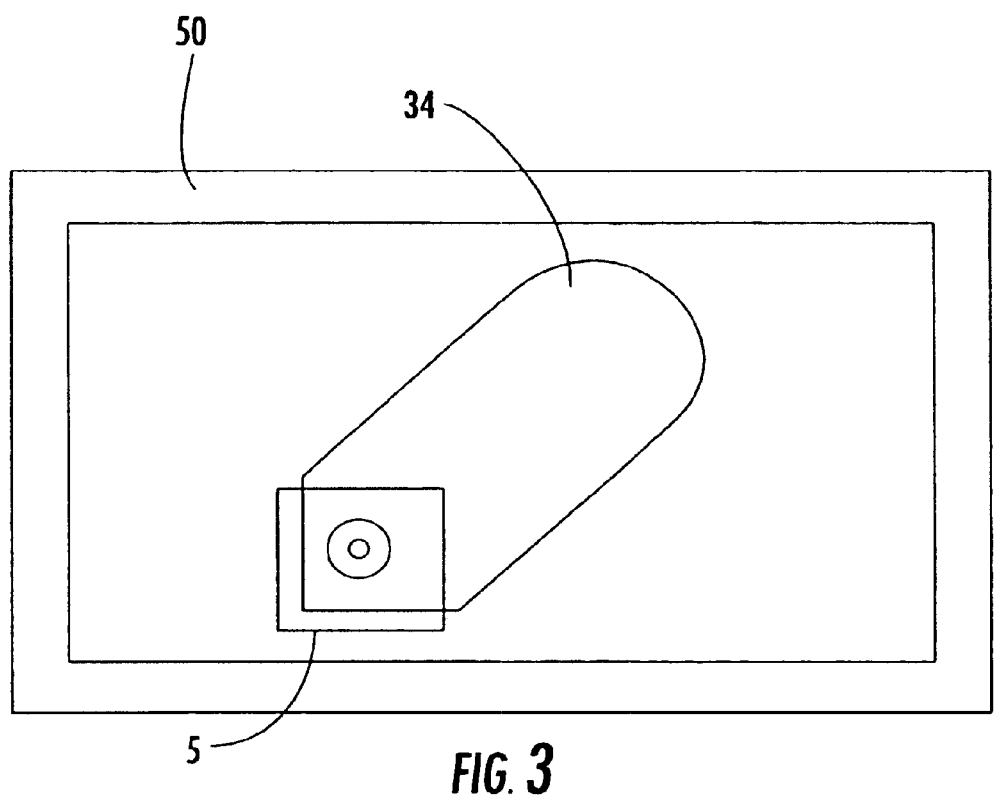
FIG. 3 is a top plan view of a conventional VCSEL with a probe pad for enabling efficient testing.
Figure 4:
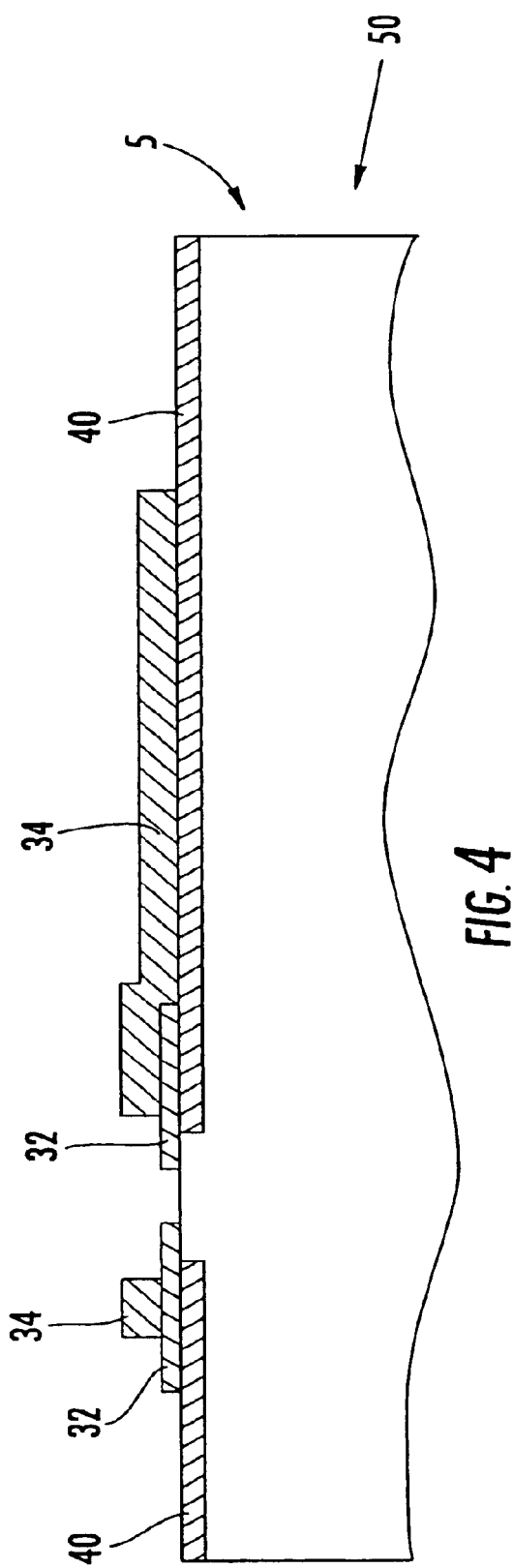
FIG. 4 is a cross-sectional side view of the VCSEL of FIG. 3.

As shown in FIGS. 3 and 4, in the preferred embodiment, the VCSEL with variable tuning layer is made by initially fabricating a wafer 50 of conventional VCSEL portions 5 leaving the surfaces of the VCSELs, which may include dielectric passivation layers, exposed. The various layers of the VCSELs are epitaxially deposited on the semiconductor substrate following techniques well known in the art. One such technique is described in U.S. Pat. No. 4,949,350, the contents of which are hereby incorporated by reference. To facilitate testing, a probe pad 34 is placed on the devices on the wafer to make a contact for electrical testing and subsequent wire bonding of the completed lasers.

Figure 5:
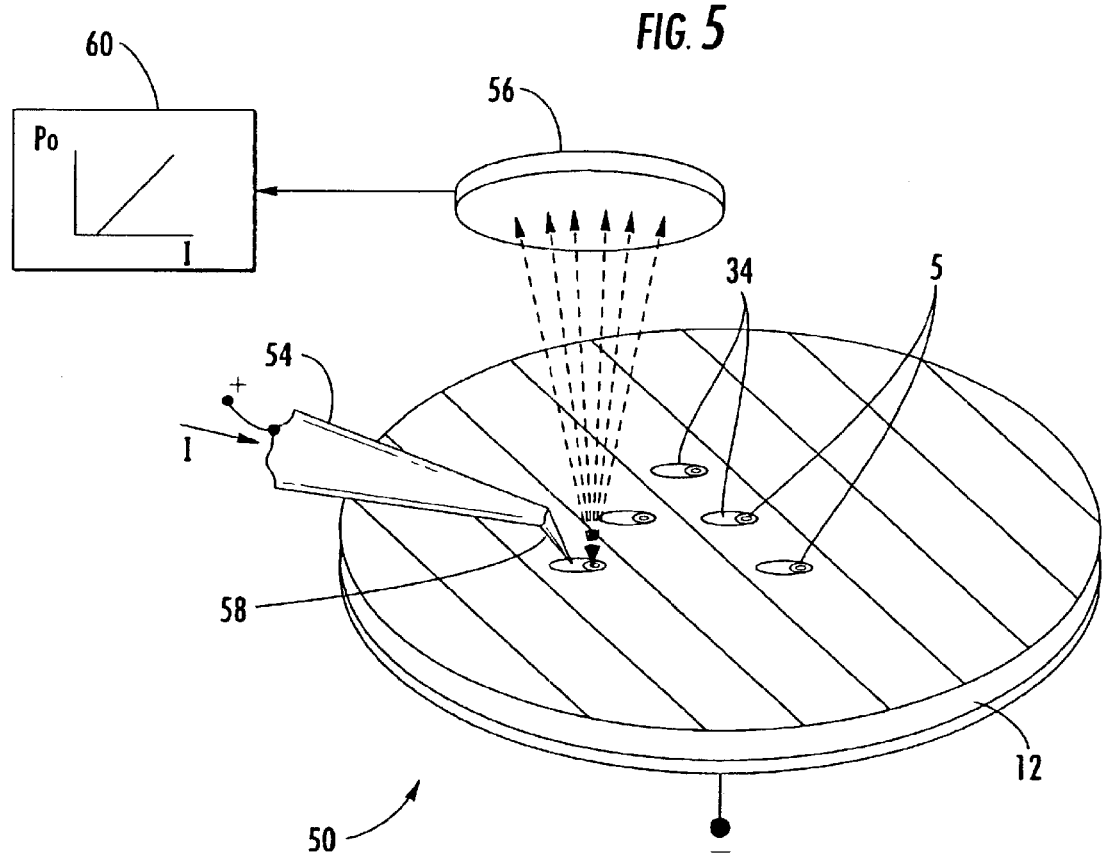
FIG. 5 is a diagram of a wafer comprising discrete VCSELs that are being tested to determine slope efficiency distribution.

Once the conventional VCSEL portions 5 are fabricated, one or more characteristics of the initial lasers, such as resistance or slope efficiency, for example, is measured directly or indirectly by any conventional method. In the preferred embodiment, the measuring step is carried out as shown in FIG. 5 by placing the wafer 50 on a grounded chuck (not shown) of a conventional autoprober 54 which is preferably modified by any suitable technique to include the disposition of a broad area photodetector 56 above the probe tip 58. The probe tip is then moved into physical contact with probe pad 34 on the initial VCSEL portions 5, enabling electrical testing.

The process of measuring the slope efficiency of the initial VCSELs 5 is preferably performed by determining the ratio of the change in laser optical output power produced by a change in the input bias current. This can be accomplished, for example, by stepping the applied bias current while measuring the optical output power with the photodetector to generate a current to light characteristic shown in box 60. In one method of calculation, the light characteristic is searched for the low current $I_{min}$ that produces a specified low level optical power $P_{min}$. The high current $I_{op}$ is then calculated by adding a specified modulation current $I_{mod}$ to $I_{min}$ such that:

$$I_{op} = I_{min} + I_{mod} \tag{I}$$

The corresponding high level optical power $P_{op}$ is determined from the measured characteristic, and the slope efficiency $\eta_{ext}$ is calculated by $$\eta_{ext} = (P_{op} - P_{min})/(I_{mod}) \tag{II}$$

The low level power $P_{min}$ and modulation current $I_{mod}$ are preferably chosen to be representative of the conditions used in the higher level assemblies. Other conventional methods such as linear regression may be used to calculate slope efficiency as is known in the art.

The measurement of slope efficiency is preferably made on a representative sample of VCSELs to capture the slope efficiency distribution for the wafer. For example, in a typical VCSEL layout, some 20,000 devices may be formed on a three inch wafer. A representative sample may be on the order of 200 devices, for example, spatially distributed on a regular grid over the wafer surface.

Once the slope efficiency has been determined, the next step in the preferred embodiment is to modify the optical efficiency of the laser in order to achieve the desired slope efficiency. The slope efficiency $\eta_{ext}$ of a laser is the product of the internal efficiency $\eta_i$ and the optical efficiency $\eta_{opt}$ $$\eta_{opt} = \eta_i \, \eta_{opt} \tag{III}$$

The internal efficiency $\eta_i$ is the fraction of electrons that are converted to photons while the optical efficiency $\eta_{opt}$ is the fraction of photons that are transmitted out of the laser. As shown in equation (III), adjusting the optical efficiency $\eta_{opt}$ so that the product is constant can compensate for variations in the internal efficiency.

The optical efficiency $\eta_{opt}$ is calculated as the ratio of the transmission to the sum of the transmission and optical losses, $$\eta_{opt} = T/(T+L) \tag{IV}$$

where T is the transmission out of the cavity where the light is generated to the output facet, and L is the sum of all other losses including transmission out the other side of the laser.

In practice, the transmission is modified by the variable tuning layer which alters the top facet reflectivity of the laser. Accordingly, the optical efficiency, and hence the slope, becomes adjusted. While the internal efficiency ordinarily varies in an unpredictable fashion, the change in transmission of the VCSEL as additional layers are deposited is highly predictable. Once the slope efficiency of the VCSEL has been measured, the internal efficiency for that wafer is essentially fixed, so the transmission can be tuned to compensate.

The thickness of the variable tuning layer 10 to achieve the desired slope is preferably determined in the following manner. A ratio is first calculated between the measured slope efficiency to the desired value, and then a predetermined lookup table, described in more detail below, is referenced which relates the slope efficiency ratio to a tuning layer thickness. The desired values of slope efficiency for the VCSELs may be based, for example, on specifications for the VCSELs or specifications for, or tests conducted on, higher level assemblies.

Figure 6:
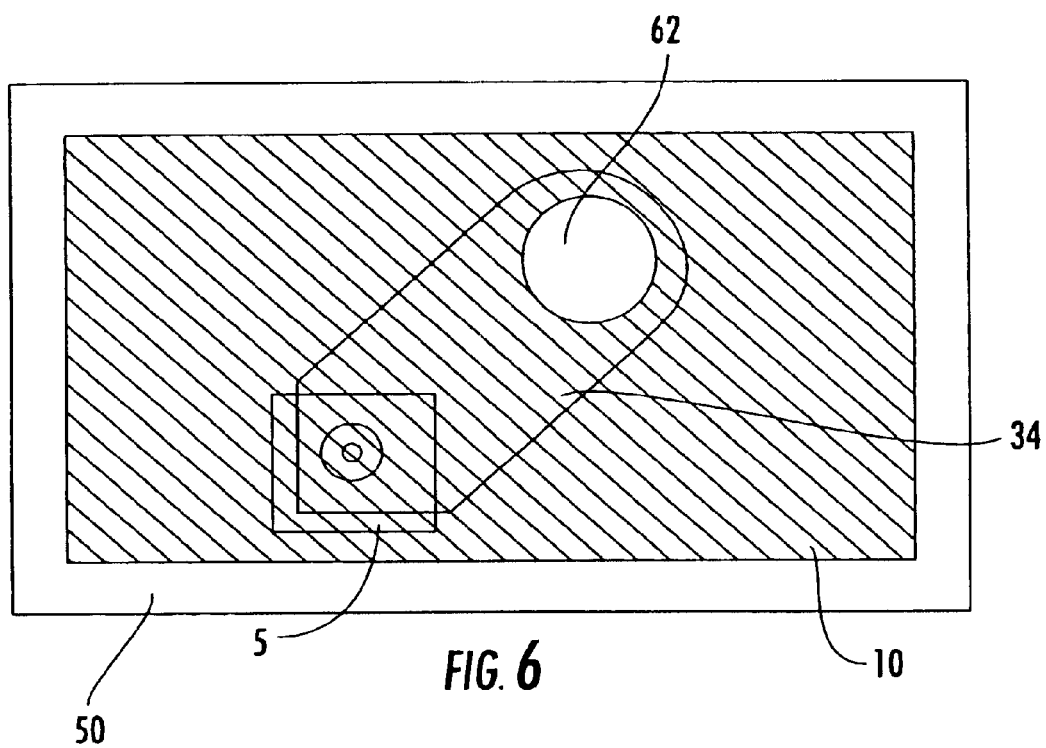
FIG. 6 is a top plan view of a VCSEL with a variable tuning layer having an etched surface for enabling contact with the probe pad for additional testing.

Referring to FIGS. 5 and 6, once the variable tuning layer 10 is deposited onto the initial VCSEL 5, via holes 62 are preferably etched to the probe pad 34 to provide a contact for further electrical testing. The representative sample lasers are preferably retested to confirm the effectiveness of the variable tuning layer 10. The tuning process may then be repeated, if needed, taking into account the tuning layer thickness already on the wafer. In practice, the tuning during the first quarter wavelength is monotonic, and therefore error in thickness is made on the low side to enable recovery from deviations by additional deposition rather than etching, although etching may be used if needed. Furthermore, the yield is preferably optimized by centering the wafer's distribution within a specification, so the above process is preferably applied to center the distribution and maximize yield.

Figure 8:
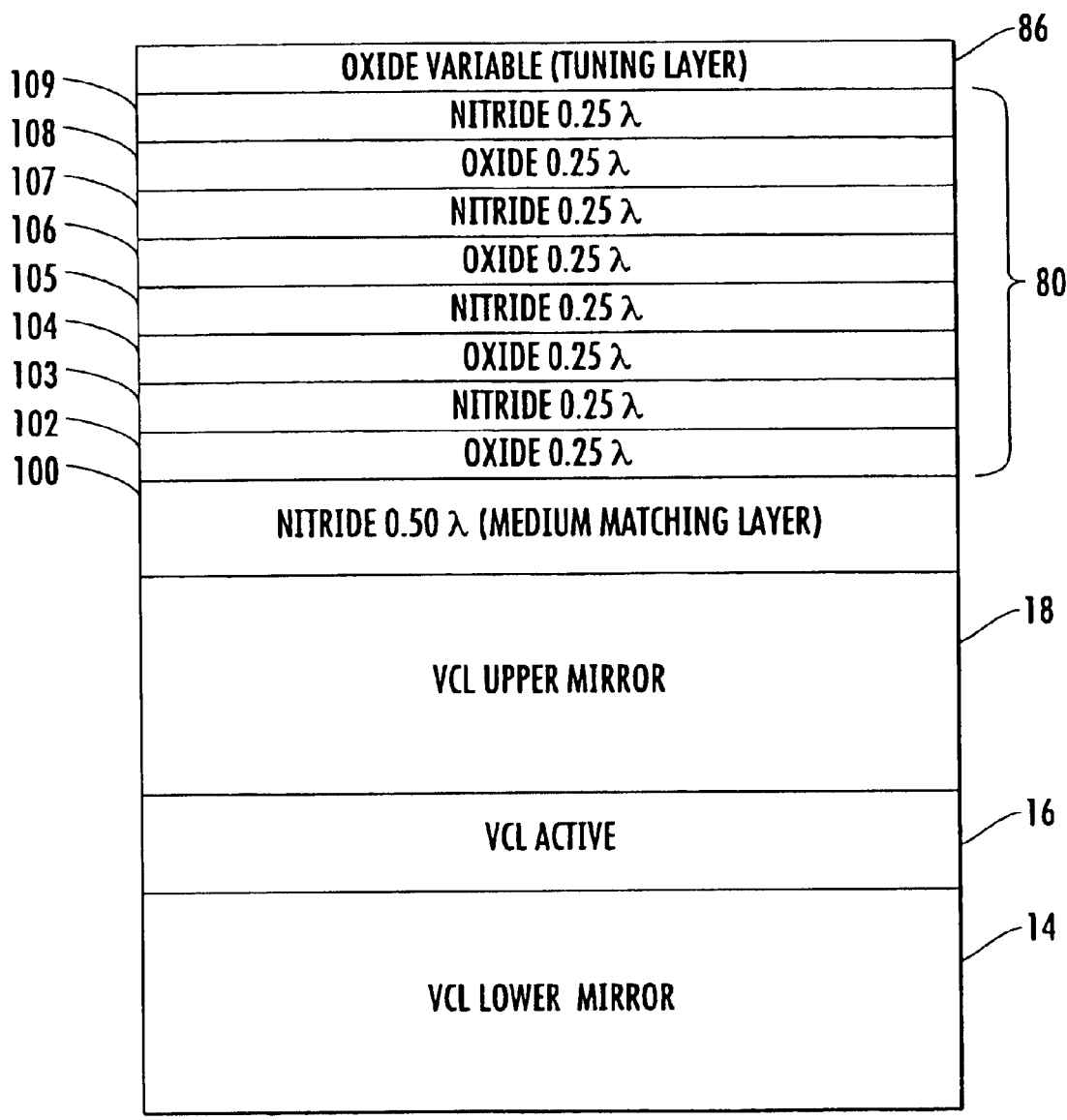
FIG. 8 is a block diagram of the layers of a distributed Bragg layer and variable tuning layer disposed on a conventional VCSEL to adjust the laser slope efficiency.

Referring to FIG. 8, the encapsulation medium matching layer 100 may be a one half wavelength silicon nitride layer, followed by four alternating pairs of one quarter wavelength silicon oxide 102, 104, 106, 108 and silicon nitride layers 103, 105, 107, 109, configured as the additional DBR 80. As is conventional in the art, the layer thicknesses are computed using the wavelength as measured in the material, so that the nitride layers with a higher index of refraction have a smaller absolute thickness than the oxide layers with a lower index of refraction. The thicknesses are preferably chosen to ensure that all reflections add completely in-phase relative to the original VCSEL upper mirror 18 reflection. The dephasing (tuning) layer 86 is a variable-thickness oxide layer whose thickness is in the range of from about zero to about one quarter wavelength, or multiples thereof, to yield a final reflection which can be continuously varied from in phase to out of phase with the preceding reflections. As the thickness of the layer increases from zero, the reflection becomes progressively more out of phase and the total transmission out of the VCSEL is increased.

Figure 9:
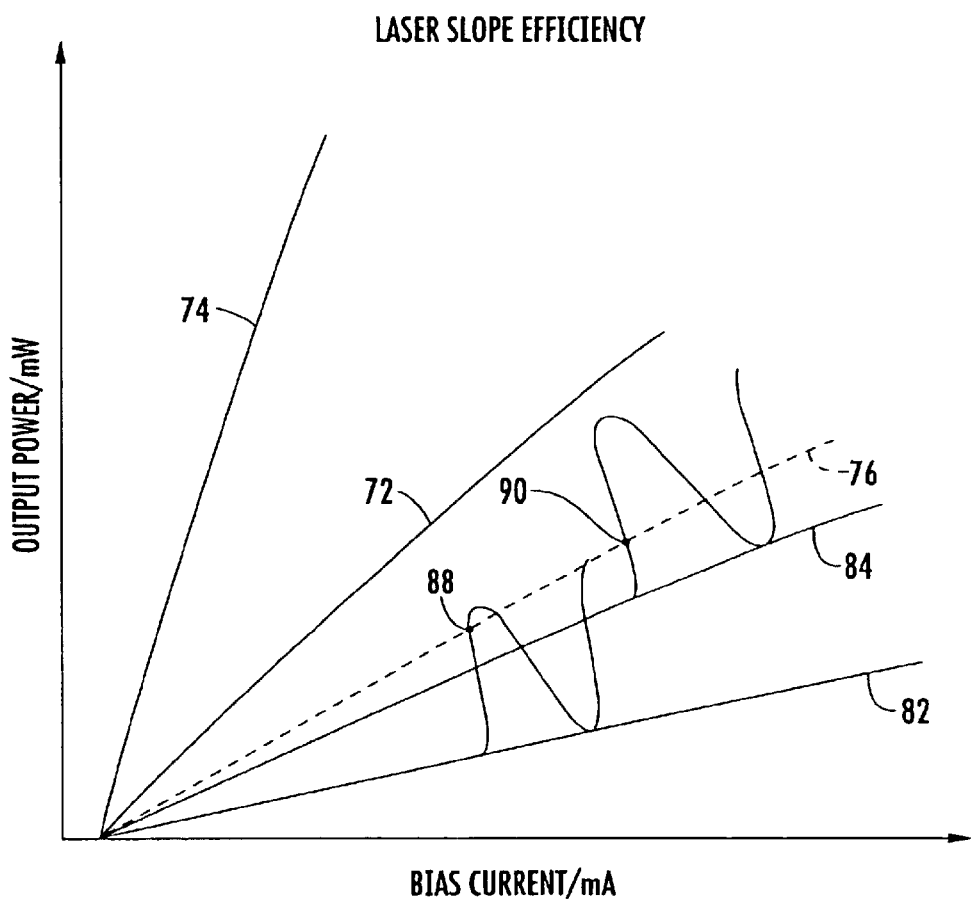
FIG. 9 is a graph of laser slope efficiencies for lasers fabricated from two different wafers, which shows differences in the slope efficiencies of lasers fabricated from different wafers and the reduced variation after tuning.

Referring to FIG. 9, the preferred process for fabricating VCSELs with consistent slopes from a plurality of wafers is disclosed by graphical illustration. Through the measuring step, tests conducted on initial lasers from two different wafers prior to the tuning process show that the wafers have substantially different slope efficiency distributions centered as shown in curves 72 and 74. Both distributions are preferably greater than the desired efficiency 76, which is preferably set at the center of the specified distribution. The presently preferred process is to deposit the four period DBR 80 (FIG. 8) over the upper mirror to reduce the slope efficiencies for the wafers below the specified range as shown in curves 82 and 84, and then to deposit the wafer specific predetermined silicon dioxide tuning layer 86 (FIG. 8) to tune the slope efficiencies for the lasers on each of the wafers toward the desired value as shown in curves 88 and 90. As shown in FIG. 9, the tuning layer 86 increases the transmission until it reaches an optical thickness of one quarter wavelength, and then the transmission is reduced to a minimum at a thickness of one half wavelength. The tuning is thus cyclical with layer thickness, oscillating with each half wavelength deposition. In another embodiment, one could start with two wafers as represented by curves 82, 84 and then increase the transmission by applying either silicon oxide or silicon nitride tuning layers as shown in curves 88 and 90.

In practice, a look up table such as in Table I is used to determine the third DBR stack and thickness of the variable tuning layer 86 to move the slope efficiency toward the center of the specification. As is shown in the "scaled" column, the tuning in the exemplary embodiment provides a 2× range (0.221/0.113) in the final slope efficiencies.

TABLE I

Exemplary Lookup Table for an 850 nm VCSEL
Including a Four Period Dielectric DBR and a
Variable Oxide Tuning Layer
(calculated up to a quarter wave optical thickness)

| VCL structure | Oxide (D) | Trans | Loss | η opt | scaled |
|---|---|---|---|---|---|
| initial | no mirror | 0.256 | 0.3 | 0.461 | 1.000 |
| 4 periods + | 0 | 0.017 | 0.3 | 0.052 | 0.113 |

TABLE I-continued

Exemplary Lookup Table for an 850 nm VCSEL
Including a Four Period Dielectric DBR and a
Variable Oxide Tuning Layer
(calculated up to a quarter wave optical thickness)

| VCL structure | Oxide (D) | Trans | Loss | η opt | scaled |
|---|---|---|---|---|---|
| 4 periods + | 200 | 0.017 | 0.3 | 0.053 | 0.115 |
| 4 periods + | 400 | 0.018 |  | 0.056 | 0.122 |
| 4 periods + | 600 | 0.020 | 0.3 | 0.063 | 0.136 |
| 4 periods + | 800 | 0.023 | 0.3 | 0.071 | 0.155 |
| 4 periods + | 1000 | 0.027 | 0.3 | 0.083 | 0.180 |
| 4 periods + | 1200 | 0.032 | 0.3 | 0.096 | 0.209 |
| 4 periods + | 1400 | 0.034 | 0.3 | 0.102 | 0.221 |

The ratio of the center of the specified distribution to the median of the measured slope efficiency distribution is referred to in the "scaled" column of Table I. The corresponding value for the oxide tuning layer thickness is then selected from the "oxide" column of Table I. For example, if a slope efficiency distribution of an initial VCSEL wafer is centered on a value of 0.44 mW/mA, and the desired center for the distribution is 0.06 mW/mA, then the ratio is 0.06/0.44=0.136 and the oxide thickness to be deposited is preferably 600 angstroms, according to the exemplary table.

Figure 7:
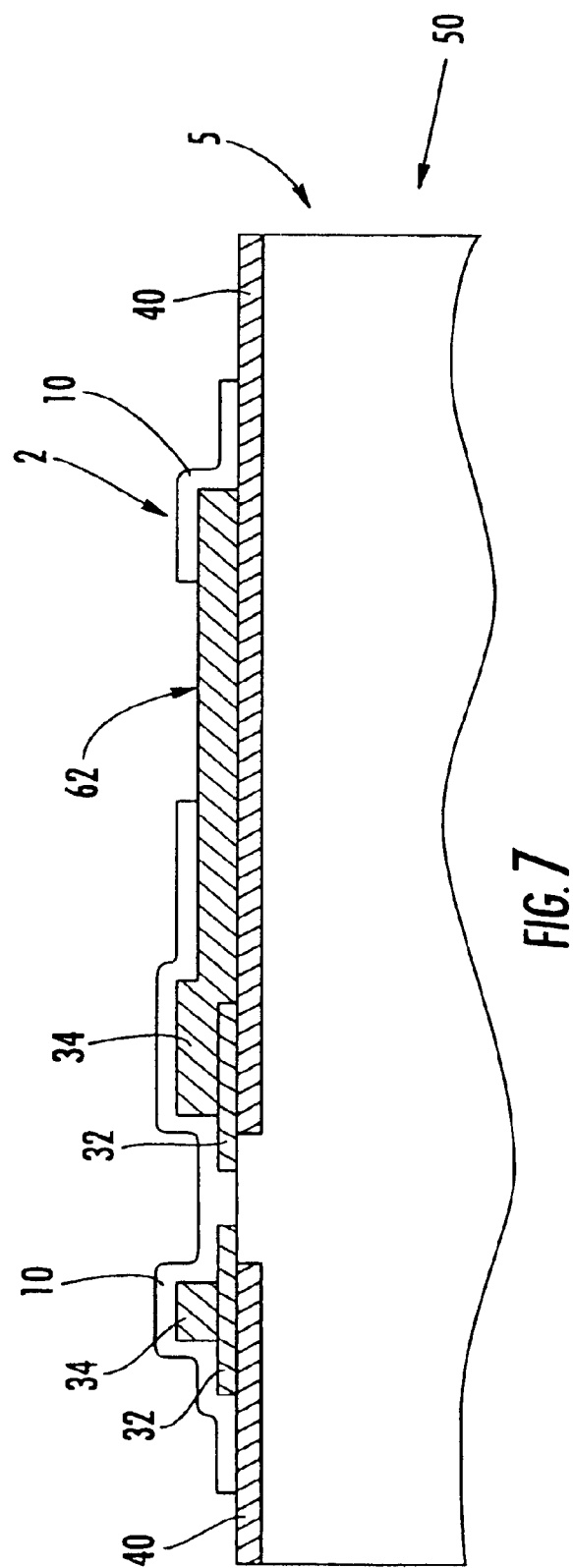
FIG. 7 is a cross-sectional side view of the VCSEL of FIG. 6.

In the preferred embodiment, the additional Bragg stack 80 and tuning layer 86 are deposited using plasma enhanced chemical vapor deposition. As is conventional in the art, such optically transparent films can be routinely deposited in increments below 50 angstroms. In addition, an adhesion layer, such as titanium, is preferably deposited onto any exposed gold surfaces prior to dielectric deposition to enable good mechanical stability of the dielectric mirror and tuning layer. The titanium layer, typically on the order of a 100 angstroms thick, may be deposited by any suitable method, such as by sputtering or electron beam evaporation. Once the dielectric mirror and tuning layer have been deposited, the film is preferably patterned and etched to create via holes (e.g., 62, FIGS. 6 and 7) for electrical contact. The patterning and via etching may be accomplished using conventional photolithography techniques to mask the films and plasma etching using any suitable reactive gas such as $CF_4/O_2$. With the additional mirror and tuning layer complete, the lasers may be retested, if desired, by any suitable method to confirm that the process achieved the desired result.

The lookup table may be determined by calculation, empirical data, or any other suitable method. To determine the table empirically, any suitable procedure may be used. In practice of a presently preferred method, a conventional VCSEL wafer is processed to a testable level, and a representative sample of lasers is tested to determine the slope efficiency. Subsequently, a third mirror comprising any desired number of DBRs (including none) is deposited, followed by a partial deposition of the tuning layer. Vias are etched in the dielectric tuning layer to enable testing, and the same sample is retested. The procedure is preferably repeated until a complete quarter-wave thickness of tuning layer has been deposited. The data for the median device provides a table of slope efficiency vs. tuning layer thickness for the device. Normalizing the slope efficiency data by the initial value produces the "scaled" column in Table I.

Alternatively, to determine the table by calculation, the transmission from the cavity out of the VCSEL surface can be calculated using conventional transmission matrices, such as those generally described in Scott, J. W., "Design, Fabrication and Characterization of High-Speed Intra-Cavity Contacted Vertical-Cavity Lasers", University of California, Santa Barbara, Electrical and Computer Engineering Technical Report #95-06, June 1995, the contents of which are hereby incorporated by reference, or by any other suitable technique known in the art. The calculation is applied to various tuning layer thicknesses, producing the data in the "T" column of Table I.

In the exemplary table set forth above, the power transmission T and round trip optical loss L are expressed in percent. The transmission is the fraction of power transmitted out of the cavity on a single reflection, while the optical loss represents the fractional power loss as a wave makes one complete round trip propagation within the cavity. The optical loss is a combination of internal losses that arise predominantly from free carrier absorption as well as transmission out the lower mirror DBR stack. In exemplary Table I, the optical loss L is presumed constant wafer to wafer and generally remains constant for a given wafer. It can also be estimated using the transmission matrix formalism, or can be determined experimentally by correlating a set of experimental slope efficiency measurements with the theoretical prediction. Once the transmission T and optical loss L have been determined, the values for the optical efficiency n opt are calculated using equation IV. To produce the scaled data, the values of $\eta_{opt}$ are normalized to the initial $\eta_{opt}$ value.

A second order effect that may be taken into account is that the transmission out of the lower mirror varies depending on the accuracy of the VCSEL growth relative to the design. These variations can usually be ignored, but may be important to consider if the growth thickness accuracy is highly variable, which may occur in some VCSEL manufacturing processes. In this case, a refinement of the described tuning process preferably includes modification of the optical loss values. The optical loss values to be used may be correlated with spectral measurements of the initial VCSEL or dynamic fits of optical loss value to agree with the change in slope observed upon the application of an intermediate dielectric deposition and test step.

Figure 10:
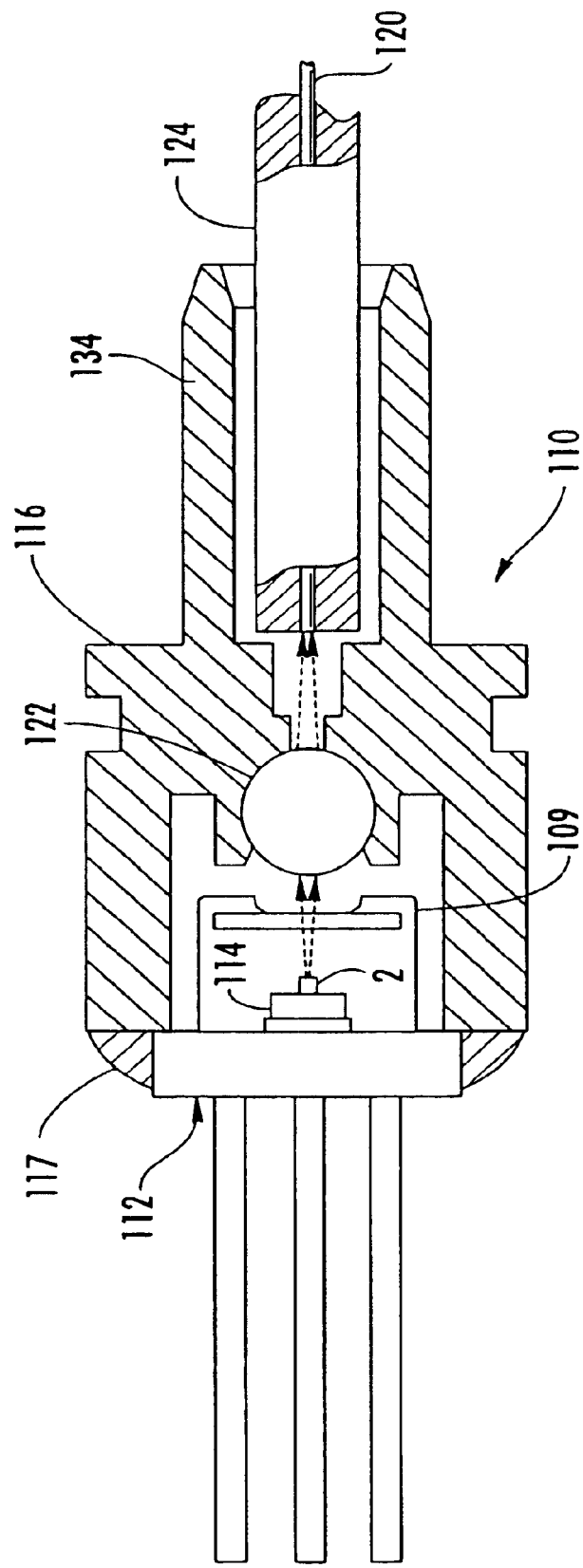
FIG. 10 is a side view, partly in cross-section, of an optical subassembly incorporating the VCSEL with variable tuning layer.

FIG. 10 illustrates the VCSEL 2 with variable tuning layer 10 mounted into an optical subassembly (OSA) 110. The OSA 110 enables application of DC biasing and AC modulation signals to the VCSEL 2. With the exception of the VCSEL 2, all of the parts of the OSA are conventional. The OSA generally comprises an electrical package 112 containing the VCSEL 2 and a power monitoring photodetector 114. The electrical package is preferably bonded to a precision molded plastic housing 116. The bonding process including conventional bonding material 117 preferably involves active alignment to optimize the coupling of the laser light into an optical fiber 120, as is conventional in the art. The OSA includes a ball lens 122 for coupling the light into the optical fiber. A ferule portion 134 of the housing 116 cooperates with the fiber assembly 124 to provide alignment of the optical fiber 120. After the electrical package 112 and housing 116 are bonded together, the fiber is removed and the OSA 110 is complete. An exemplary optical subassembly is also described in U.S. patent application Ser. No. 08/900,507, filed Jul. 25, 1997, the contents of which are hereby incorporated by reference.

By obtaining a more accurate slope for the VCSEL 2, more toleration for mechanical variances in the OSA 110, and in the higher level assemblies is permissible. These mechanical variances may include, for example, variations in concentricity from fiber to fiber, sub optimal active alignment variations, shifts in mechanical position due to environmental changes such as temperature, and normal connector tolerances to allow insertion of a fiber into the housing. Allowing increased mechanical variation reduces manufacturing complexity and increases yield, thereby resulting in lower overall product cost. Alternatively, the mechanical tolerances may be maintained at current levels to yield an OSA with more consistent performance characteristics.

Figure 11:
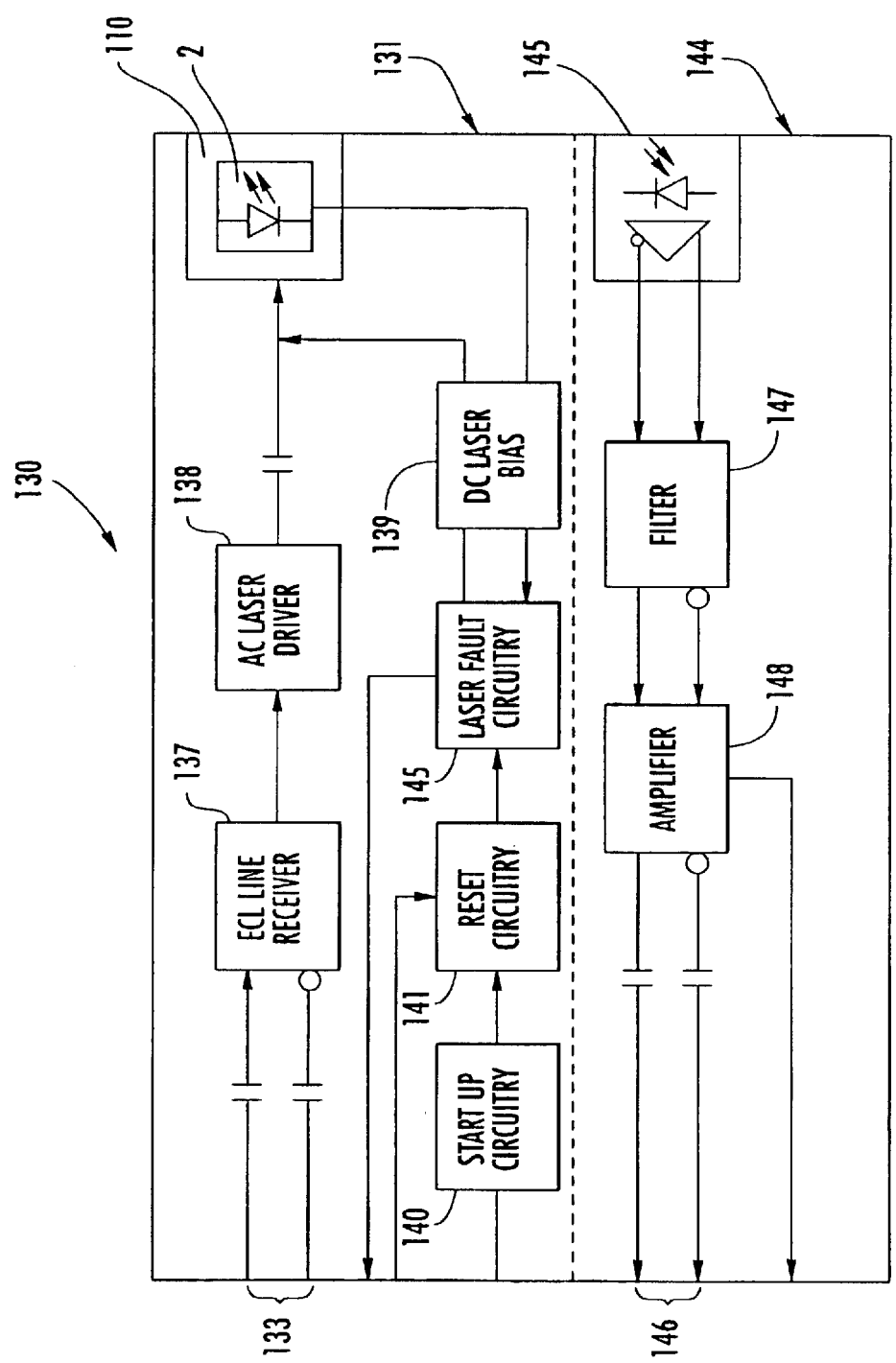
FIG. 11 is a block diagram of an optical transceiver incorporating the optical subassembly of FIG. 10.

FIG. 11 illustrates in block diagram form an optical transceiver 130 incorporating a VCSEL 2 with variable tuning layer fabricated according to the inventive method. With the exception of the VCSEL 2, all of the parts of the optical transceiver are conventional. The transceiver includes a transmitter portion 131 and a receiver portion 144. The transmitter portion provides an interface between a differential input 133 and an optical fiber output. In operation, a differential input signal is converted to a single ended signal by emitter coupled logic (ECL) line receiver 137 and an AC modulation signal is applied to the single ended signal in laser driver 138. A DC bias signal is then applied to the signal by DC laser bias signal generator 139 for application to the OSA 110. Start up circuitry 140 and reset circuitry 141 is preferably provided to control the transmission of data over the optical fiber. A laser fault indicator 145 provides a status indication of the transmitter portion 131.

The receiver portion 144 takes an input from an optical fiber provided through a photodetector 145 and converts it to a differential output signal. The receiver pre amp signal is preferably low pass filtered in filter 147 to remove any high frequency noise present, amplified in amplifier 148 to regenerate the digital signal, and then transmitted off the board through the differential output 146.

The use of VCSELs with highly consistent slopes in optical transceivers enhances the performance and reliability of the data communications system. This is because the total optical subassembly slope variation can be effectively tuned to fall within specification, so the drive circuit will not have to be used to compensate. Such a system will not suffer from changes in high speed performance, and will therefore have the desirable effect of generally improving overall product consistency and yield.

The VCSEL described above, or other optoelectronic component, may be encapsulated in plastic, epoxy or other suitable encapsulant. The primary benefits of such a package are cost and manufacturability, which may be superior to the conventional metal package. The encapsulation should preferably be optical grade plastic suitable for encapsulating a laser and other semiconductor components while also allowing transmission of light. One suitable plastic is sold by Dexter Electronic Materials Division, Industry, California, under the trademark HYSOL®.

The plastic encapsulation package preferably contains a tilted window beamsplitter for obtaining accurate monitoring and feedback as previously described. The beamsplitter window may be formed of an air gap, glass, plastic or adjacent media of differing indices of refraction, and may be fabricated in a number of ways. The various embodiments take into account the differing indices of refraction to provide the proper feedback of radiated light toward the photodiode. In addition, the geometries are preferably chosen to ensure a consistent sampling of the beam at both high and low beam divergence which may result from different drive currents and temperatures. The disclosed embodiments also serve to reduce inaccuracy in monitoring and feedback due to modal variations in the radiated beam.

Figure 12:
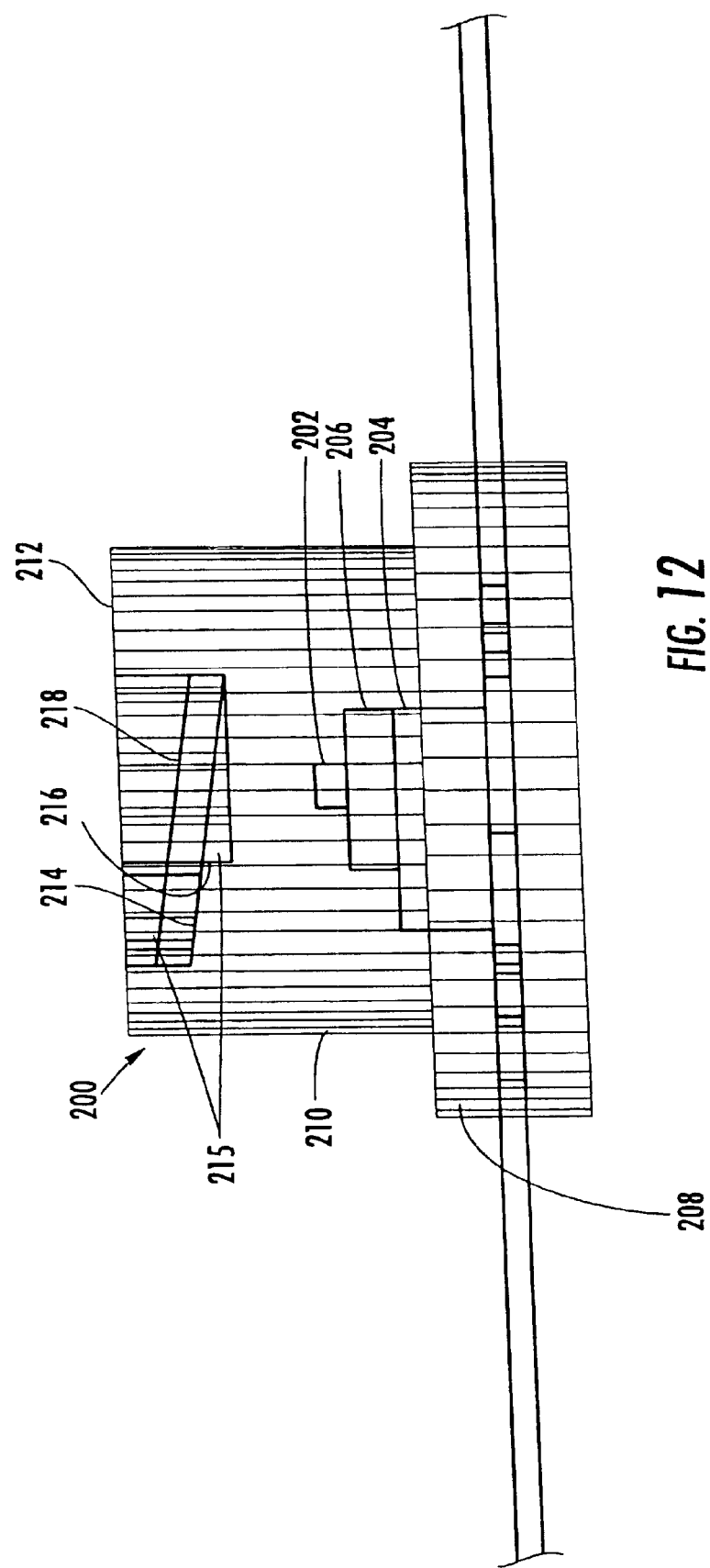
FIG. 12 is a perspective view of a plastic encapsulation package for replacement of the package shown in FIG. 10.

Referring to FIG. 12, the plastic encapsulation package 200 has substantially the same dimensions as the conventional metal package 109 used in the optical subassembly 10 of FIG. 10. This embodiment has the advantage of allowing replacement of the package in the subassembly without significantly impacting other aspects of the subassembly. The encapsulation substantially encapsulates a VCSEL die 202 and a photodiode 206 which may be mounted on a conductive or insulative stand 204 for electrical or thermal dissipation considerations.

The package preferably includes a base portion 208 that replaces the standoff 112 (FIG. 10) in the optical subassembly, and a cylindrical body portion 210 which is formed by the encapsulation material. The top 212 of the body portion preferably contains a recess 214 containing a ledge 216. The ledge is positioned to house a tilted window beamsplitter 218 in optical alignment with the VCSEL for reflecting a portion of the radiated light toward the photodiode 206. The window is preferably glass. The index of refraction of the glass, in conjunction with the indices of refraction of air gaps 215 in the recess and the plastic encapsulation, provides the necessary refraction to appropriately direct a representative sample of the radiated beam onto the photodetector while transmitting an undistorted beam into the output.

Figure 13:
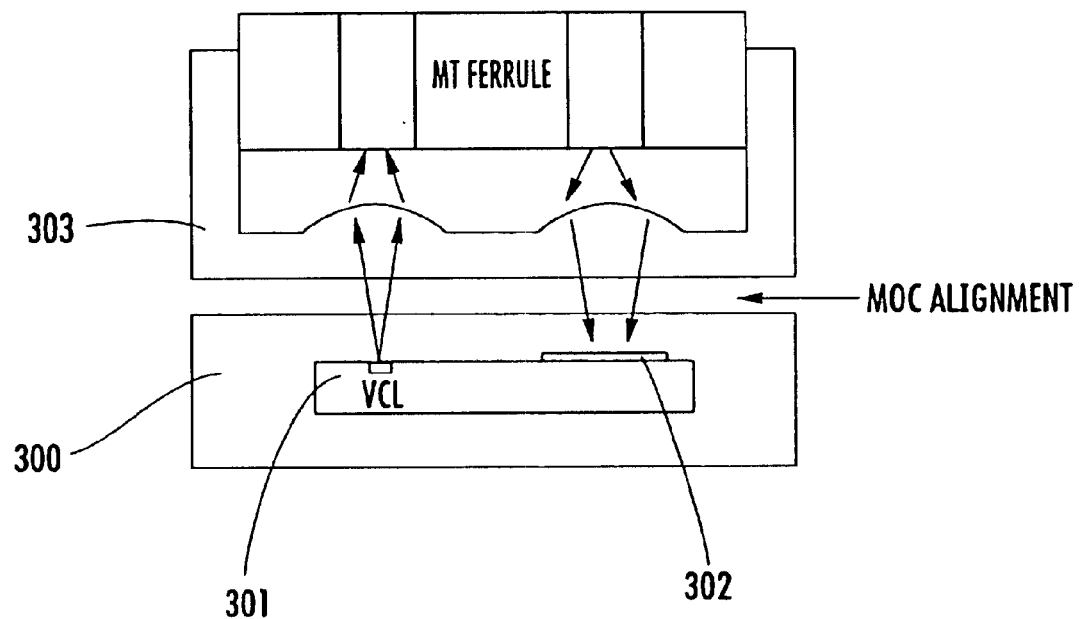
FIG. 13 show alternate embodiments of a VCSEL incorporated within a small form factor package.

Referring to FIG. 13, the above power monitoring arrangement may be incorporated into a plastic system of lenses to provide transmit/receive functions. One method of construction, known as the small form factor (SMFF) package 300, encapsulates the laser 301 and receiver 302 in plastic, and then aligns and attaches a plastic lens/fiber connector piece 303 onto the encapsulated devices. The benefit of this approach is that the plastic encapsulation may be performed with mechanical tolerances typical of the technology, on the order, of 25 to 50 microns. The precise alignment to <5 µm of the fiber and lens to the devices is achieved during a subsequent alignment step, effectively decoupling the two technologies. For such applications the alignment may be done using active electrooptic measurements or with vision aided alignment. The advantage of a vision system is that the alignment may be done in an automated fashion, stepping from device to device on a regular pattern on a leadframe. This cassette driven approach may provide substantially higher throughput on the equipment, reducing overall cost.

Figure 14:
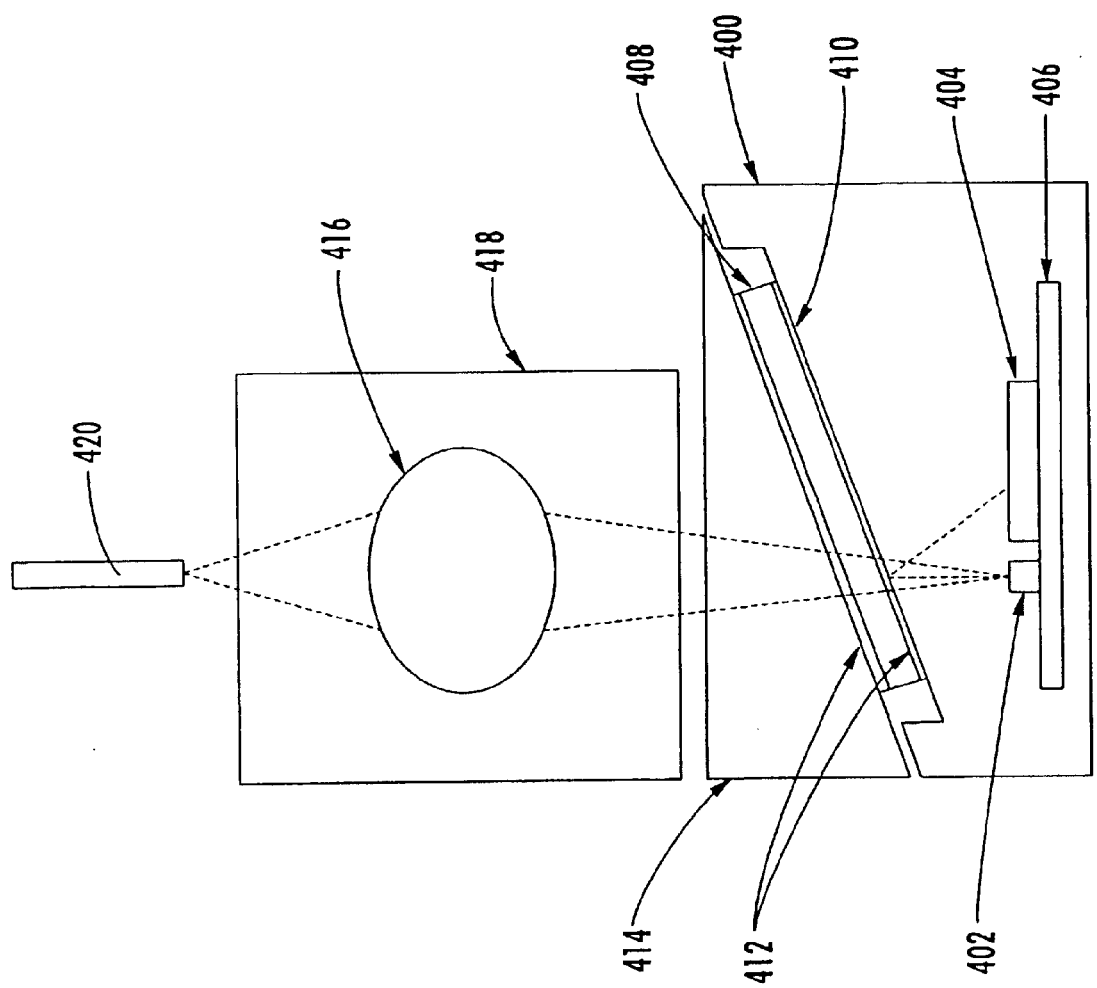
FIG. 14 is a cross sectional diagram of plastic molded package with a VCSEL adjacent to a power monitoring photodetector, a tilted window with a reflective coating for providing feedback to the photodetector and a separate, single plastic piece containing a lens barrel and a focusing lens for focusing the transmitted light into a fiber.

Referring to FIG. 14, another plastic molded package 400 (index n1) (n1) encapsulates the VCSEL die 402, photodiode 404 and substrate 406. The substrate 406 may be any material suitable for the attachment of semiconductor die, such as a metal leadframe, a ceramic substrate, or a standard printed circuit board epoxy/glass laminate. In the preferred embodiment, a tilted window 408, preferably made of glass having an index of refraction (n2), is coupled to the plastic molded package 300. The tilted window 408 is preferably coated with a ¼ wave reflective coating 410, having an index of refraction (n3) that may be tailored to obtain optimal monitoring and feedback. In the preferred embodiment, an optically clear epoxy 412 with a refractive index (n4), that substantially matches the refractive index n1 of the plastic molded package 400, couples the tilted window 408 to the plastic molded package 400. The reflectance of the tilted window and quarter wave coating may be adjusted by adjusting the index ratio n2/n3.

In this embodiment, the index of refraction of the quarter wave coating 410 is preferably higher than the refractive index (n1) of the plastic molded package 400. Preferably, the refractive index of the plastic molded package, (n1) and the refractive index of the tilted window n2, are comparable. Therefore, the power reflected at the interface of the tilted window 408 and the plastic molded package 400, given by the square of the ratio (n1−n2)/(n1+n2), is relatively small.

In the preferred embodiment, the refractive index n3 of the quarter wave reflective coating 410 may be tailored to significantly reflect incident light utilizing readily implemented manufacturing processes.

For example, if the refractive index of the plastic molded package n1 is 1.5 and the tilted window 408 has a refractive index n2 of 1.45, the net reflection at the interface of the plastic molded package and the tilted window would be approximately 0.03%. However, treating the tilted window 408 with a quarter wavelength thick layer of silicon nitride, with a refractive index n3 of 2.0, increases the reflected power to 9%. Advantageously, the silicon nitride may be uniformly and precisely deposited using conventional techniques such as plasma enhanced chemical vapor deposition. The quarter wave reflective coating 310 should preferably be uniform to avoid distorting the beam. In addition, the optimum quarter wave thickness may be effectively realized in conjunction with multiple half wavelength deposits of the coating as may be desirable from a manufacturing perspective, (thickness=¼l+nl/2, where n is an integer).

A glass or plastic triangular shaped plastic piece 414 may be coupled to the top surface of the tilted window 408 using an optically transparent epoxy 412 with a refractive index (n4) which substantially matches the refractive index of the tilted window (n2). A lens 416 is preferably housed in a conventional lens barrel 418. The fiber 420 is aligned above the lens barrel 418.

As an alternative to applying a ¼ wave reflective material such as silicon nitride on the tilted window 408, a thin metallic coating on the window may also be utilized to control the power level of light reflected from the tilted window 408. For example, a layered coating of titanium and gold may be used to reflect a small percentage of the beam while transmitting the majority of the beam through the coating. An alternate embodiment includes a titanium layer in the range 20 to 50 Angstroms, deposited directly on the tilted window 408, followed by a 100 to 200 Angstrom layer of gold deposited on the layer of titanium.

Additional examples of plastic encapsulated optoelectronic devices that maybe manufactured according to the teachings of the present invention are set forth in U.S. patent application Ser. No. 09/531,442 entitled "VCSEL Power Monitoring System Using Plastic Encapsulation Techniques", filed Mar. 20, 2000, the contents of which have been incorporated by reference.

Figure 15:
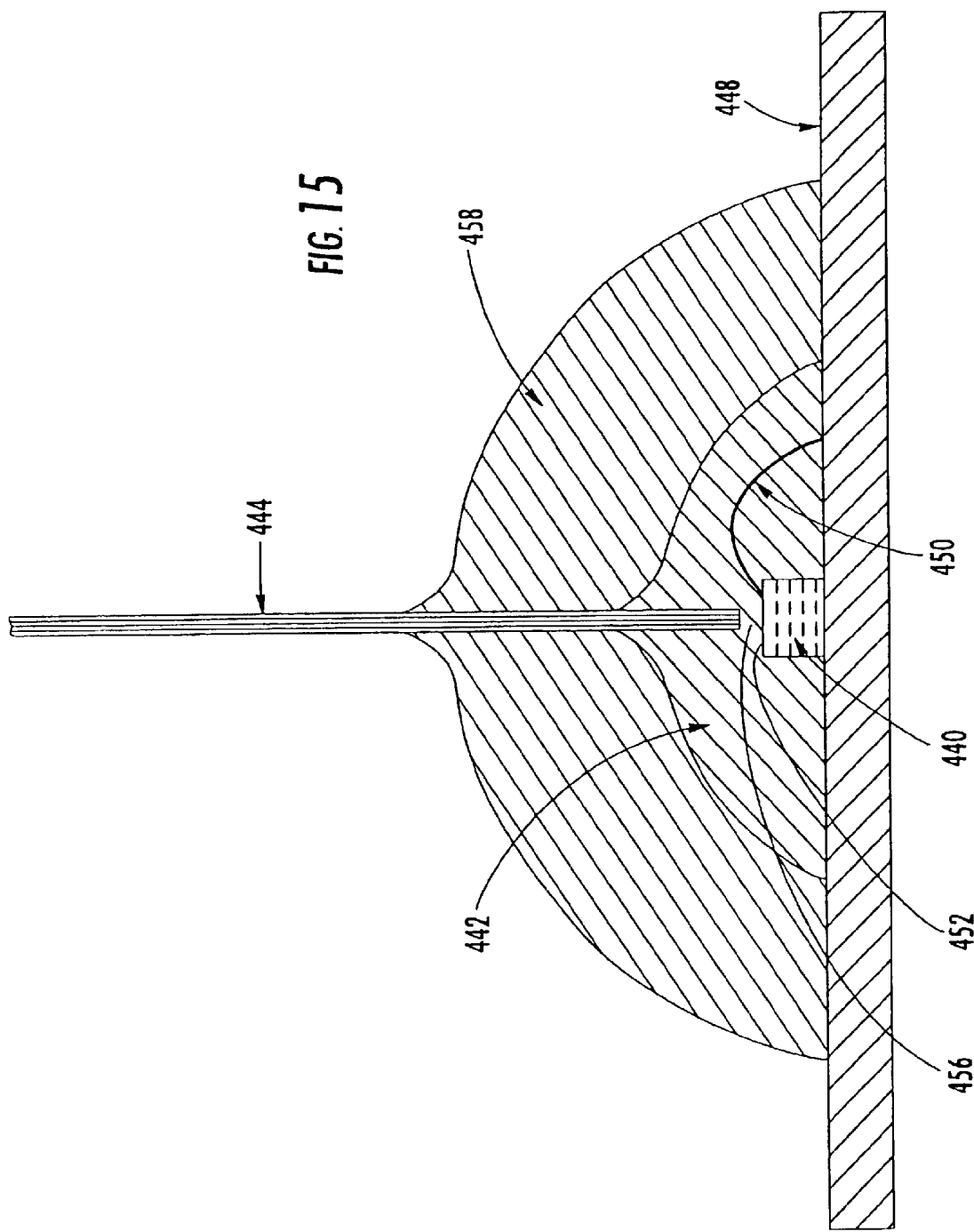
FIG. 15 is a conventional epoxy butt coupling for coupling an optoelectronic component such as a VCSEL or resonant cavity photodetector to a fiber without the use of optics.

Referring to FIG. 15, the optoelectronic device 440 may alternatively be encapsulated in an optically transparent epoxy 442 such as is used in direct butt-coupling to a fiber 444. The optoelectronic device is connected to a substrate 448 through a conventional wire bond 450. In a butt-coupling approach, the fiber 444 is epoxied directly to the device surface 452 with the optically transparent epoxy 442 filling the minor gap 456. Additional mechanically stable epoxy 458 may be used for further support. This simple approach is highly desirable as it removes the need for any optical elements. The fiber 444 can be placed vertical to the surface 452, as shown, or parallel with a 450 metallized facet positioned to reflect the light down the fiber. Many other configurations fall within the scope of the invention, the critical step being the change of the material on the surface of the optoelectronic device.

The present invention includes as a particularly preferred embodiment, a design for an optoelectronic component, such as a VCSEL, LED or resonant cavity photodetector (RCP), whose transmission does not change upon encapsulation by a material with a known index of refraction. The optoelectronic component may be encapsulated in any suitable manner, including in any one of the plastic encapsulation or epoxy encapsulation approaches as set forth above.

In practice, the surface reflection of the optoelectronic component typically is very different depending on whether it is terminated in air or the encapsulant, with a much larger reflection in the case of air. It is known that the surface reflection can be made out of phase with the rest of the mirror, effectively increasing the transmission. The amount of the transmission increase can be adjusted by controlling the thickness of the surface layer. Once the VCSEL is encapsulated, the surface reflection is reduced, and the transmission at the facet is increased but the dephased reflection is also reduced. By adjusting the surface layer thickness correctly, the overall transmission from the laser into the terminating material is unchanged, be it air or encapsulation. As a result, the laser properties such as slope efficiency and threshold current are unchanged upon encapsulation.

Distributed Bragg reflectors are generally used by those skilled in the art to create the optical feedback required for VCSEL lasing action. The facet of the laser is therefore completed with a material, typically semiconductor or silicon nitride, in contact with air of vacuum. The field reflection coefficient, $r_{12}$ as a wave traveling in material 1 strikes the interface with material 2 is given by:

$$r_{12} = (n1-n2)/(n1+n2) \quad (1)$$

where $n_1$ the index of refraction in material 1 and $n_2$ is the index of refraction in material 2. The power reflection coefficient is given by $$R_{12} = r_{12} \, r_{12}^* \quad (2)$$

where $r_{12}^*$ is the complex conjugate off $r_{12}$ If the final material is changed from air to plastic, for example, $\eta_2$ changes from 1 to 1.5 respectively. If the initial material is GaAs, with an index $\eta_1$ of 3.5, the power reflection changes from 0.31 to 0.16 respectively. If some special technique is not employed, the transmission out of the laser will be substantially changed upon encapsulation.

The slope of a laser, $\eta_{ext}$ is generally describe as the product of the internal efficiency ni and the optical efficiency $\eta_{opt}$ $$\eta_{ext} = \eta_i \, \eta_{opt} \quad (3)$$

The internal efficiency is the fraction of electrons that are converted to photons while the optical efficiency is the fraction of photons that are transmitted out of the laser. Variations in the doping, current confinement and active region properties all effect the internal efficiency. The optical efficiency is calculated as the ratio of the transmission to the sum of the transmission and optical losses, $$\eta_{opt} = \frac{T}{T+L} \quad (4)$$

where T is the transmission out of the cavity where the light is generated to the output facet and L is the sum of all other losses including transmission out the other side of the laser. The transmission and losses can be calculated as described in detail in the Ph. D dissertation, "Design, Fabrication and Characterization of High-Speed Intra-Cavity Contacted Vertical-Cavity Lasers," University of California, Santa Barbara, Electrical and Computer Engineering Technical Report #95-06, June 1995, the contents of which are hereby incorporated by reference. The threshold current of a semiconductor diode laser is the amount of electrical current that must be supplied to sustain the population inversion that is required to provide the threshold optical gain, $G_{th}$ The threshold optical gain is given by $$G_{th} = T + L \quad (5)$$

It is therefore clear that substantial changes in transmission will have significant effects on the laser slope and threshold current.

If an encapsulation medium matching material (medium matching), whose index of refraction is similar to the encapsulant, is disposed on top of the laser as a part of a dielectric mirror, its surface reflection will, essentially vanish upon encapsulation. Optically, it is part of the encapsulation. For example, silicon dioxide, $SiO_2$, has an index of refraction of 1.45. The power reflectivity for termination with air is 3% but drops to 0.03% when terminated by an index of 1.5. Oxynitride, $SiN_xO_y$, can be used as a medium matching material whose index can be controlled between 1.45 and 2 for a better match with the encapsulant.

Figure 16:
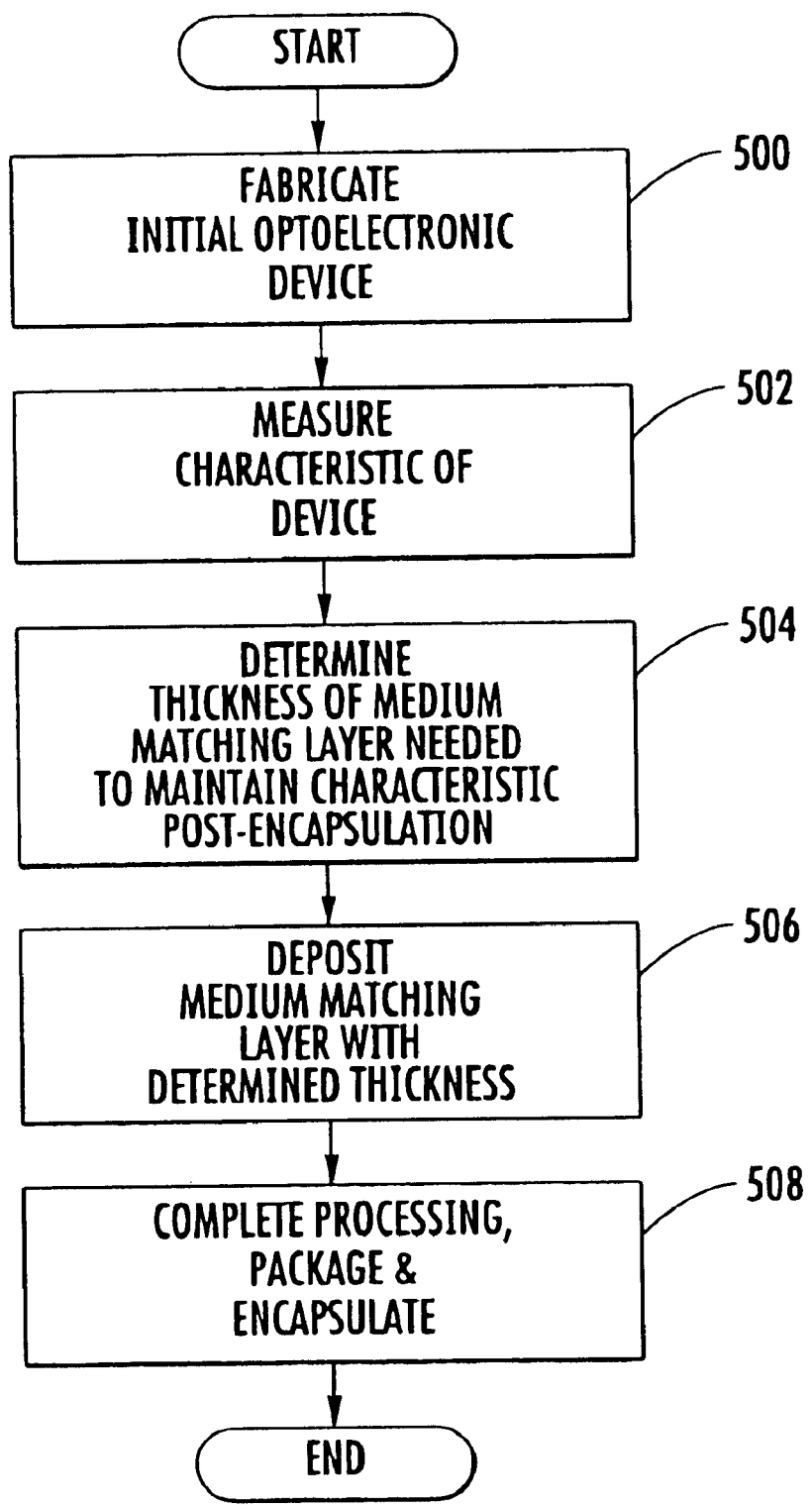
FIG. 16 is a is a flow diagram for a process of manufacturing an optoelectronic device according to the present invention having a medium matching layer for enabling the device to have the substantially the same characteristics before and after encapsulation.

Referring to FIG. 16, in one embodiment of the invention, the method involves fabricating the initial optoelectronic device (step 500), measuring a characteristic of the device (step 502), determining the thickness of a medium matching layer needed to maintain the characteristic substantially the same post-encapsulation (step 504), depositing the medium matching layer with the desired thickness (step 506), and completing the processing (e.g., testing), packaging and encapsulation of the device (step 508).

For a VCSEL, the design procedure is as follows. The transmission from the VCSEL cavity out of the top facet into the encapsulating index is calculated without the medium matching layer. Then the transmission is calculated with termination in air with the medium matching layer whose index matches the encapsulant. The thickness of the medium pa matching layer is adjusted until the transmissions are the same.

In a presently preferred embodiment, the process includes growing a VCSEL wafer, fabricating it into lasers, and then depositing a dielectric distributed Bragg reflector. The materials used are typically silicon nitride, $Si_3N_4$ and silicon oxide, $SiO_2$, which are transparent to the wavelengths of our lasers and can easily be deposited using plasma enhanced chemical vapor deposition. Layer thickness is specified in terms of optical wavelengths as is standard in the art.

The transmission of the mirror is calculated for termination on both air (n=1) and plastic (n=1.5) using the transmission matrix formalism. The results at 850 nm, the design wavelength in this example, are given in the table of FIG. 17. As shown in the table, at a thickness of 840 angstroms, an oxide phase matching layer provides the same transmission and hence laser properties regardless of whether the laser facet is terminated in air or plastic.

Figure 18:
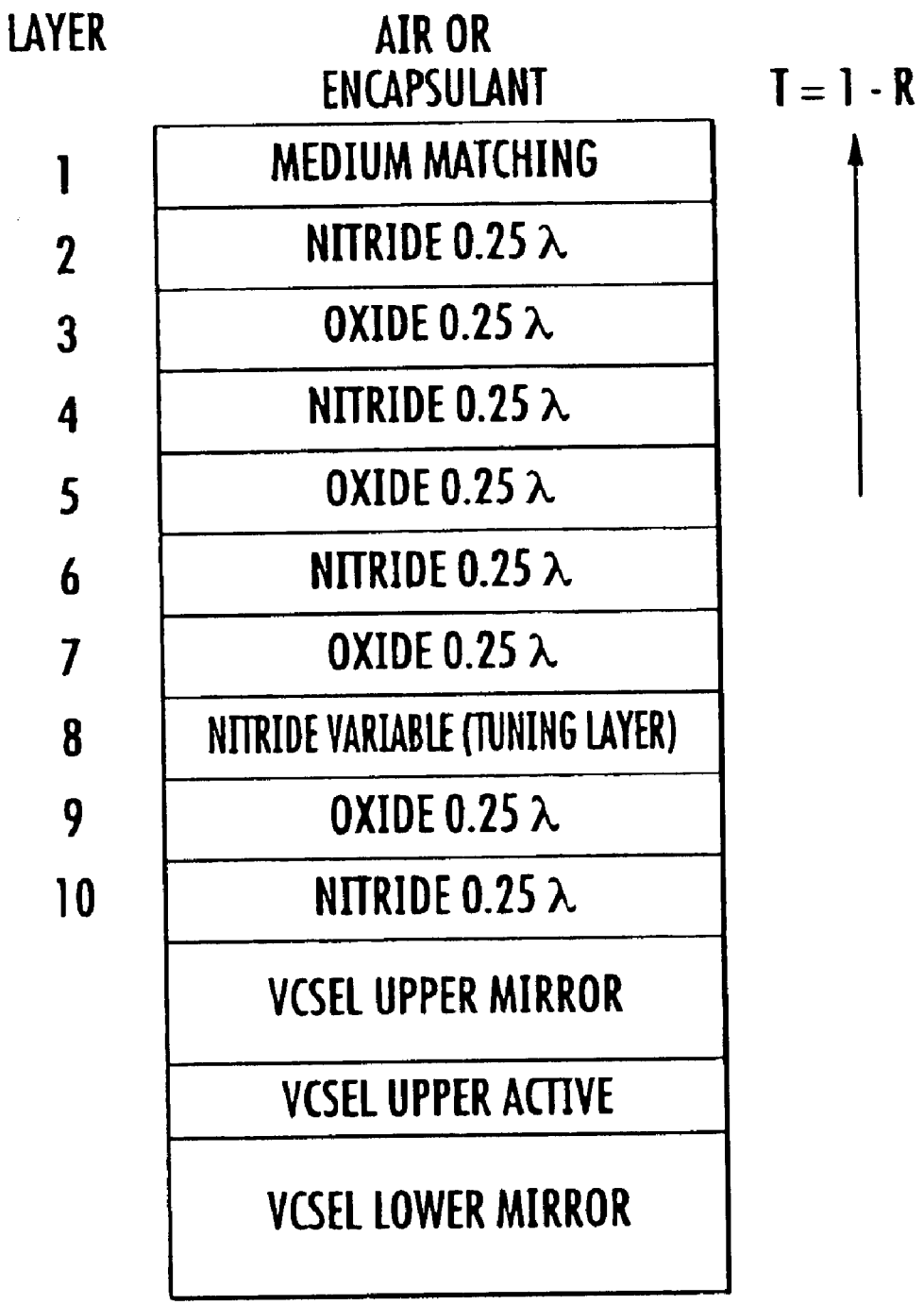
FIG. 18 is a diagram of an encapsulated VCSEL with a variable tuning layer and a medium matching layer having a slope efficiency that is substantially the same as the slope efficiency of the VCSEL prior to encapsulation.

This invention of a medium matching layer can be combined with the previously disclosed tuning layer process, disclosed in detail above, which adjusts the laser slope based on test data of the "as grown" VCSEL to provide consistent slope efficiencies. In the case of the desire to provide both encapsulation medium matching and slope tuning, one of the layers in the lower dielectric mirror can be tuned while the top medium matching layer is designed to ensure unchanging slope upon encapsulation. For example, referring to FIG. 18, a layer 1 is a silicon oxide medium matching layer while the silicon nitride mirror layer 8 can be utilized as the tuning layer. Because the distributed Bragg reflector is a coupled system of reflections, the two cannot be optimized independently but can be easily designed using the transmission matrix formalism, the results of an example are shown in FIG. 19. The transmission is matched for both air (n=1) or plastic (n=1.5). The nitride has an index of refraction of 2. A quarter optical wave at 850 nm is given by 8500/(4*2)= 1062 angstroms. We therefore start with 1062 angstroms and can either increase or decrease its thickness, as the tuning is periodic with every half wave or 2125 angstroms. Using the modified table shown in FIG. 19, all the tuning layer processes previously disclosed are applicable.

Accordingly, the non-quarter wave layer is disposed whose thickness and surface reflection create the same transmission as when the material is embedded in a material whose index is similar to the medium matching layer, effectively eliminating the dephased surface reflection. The medium matching layer can be any number of materials transparent to the light whose index is similar to the encapsulant. The use of four periods of oxide/nitride layers is not essential to the invention. It would be possible to use any number of layer combinations; it is the design for substantially identical transmission in air or encapsulant that is unique.

Figure 20:
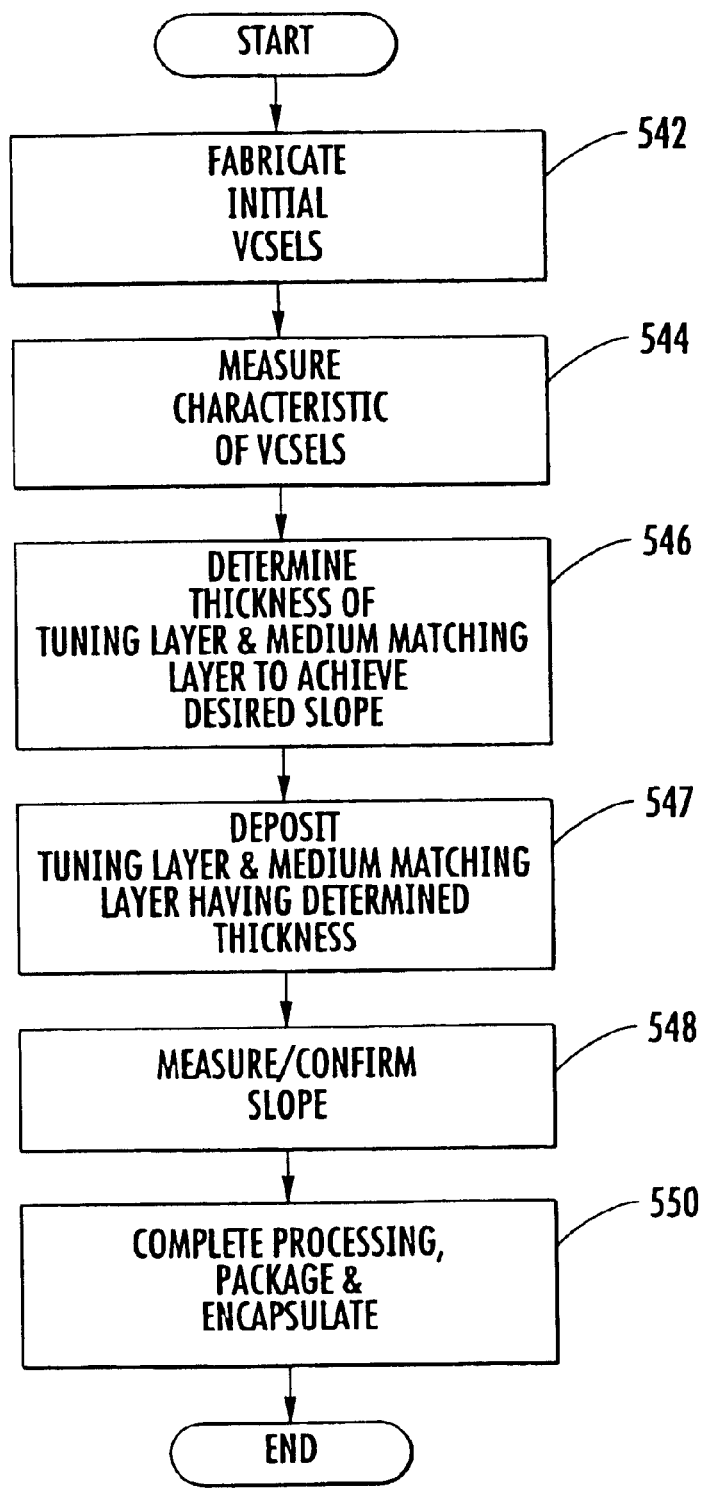
FIG. 20 is a flow diagram for a process of manufacturing a VCSEL according to the present invention having both a variable tuning layer and a medium matching layer for enabling the VCSEL to have substantially the same slope efficiency before and after encapsulation.

Referring to FIG. 20, the steps of this process therefore include fabricating the initial VCSELs (step 542), measuring the slope efficiency of the VCSELs (step 544), determining the thicknesses of the tuning layer and medium matching layer to achieve the desired slope efficiency (step 546), depositing the tuning layer and medium matching layer as indicated above having the determined thicknesses (step 547), measuring/confirming the slope (step 548), and processing, packaging and encapsulating the VCSELs (step 550).

An advantage of this invention is that the test data taken while the die are still in wafer form remain unchanged when the lasers are encapsulated. Wafer level testing is the lowest cost approach and allows the selection of only "known good die" to enter the value added packaging processes. Without this invention, careful correlation of performance data, before and after encapsulation, would have to be used to set wafer-level specifications, along with additional testing requirements of packed lasers that can be eliminated by the use of this invention to enable accurate testing at the wafer level. For example, measuring the temperature performance of the lasers to enable determination of optimum current operation over temperature is an effective manufacturing solution that becomes much more difficult once the laser properties change upon ncapsulation of epoxy assembly. Many other applications for VCSELs beyond communications will also benefit from laser properties that remain unchanged upon encapsulation. For example, sensing application may use encapsulated VCSELs where the laser properties need to be well controlled.

Those skilled in the art will understand that various modifications can be made to the present invention without departing from its spirit and scope. For example, the teachings of this invention may readily be applied to other types of optoelectronic components, such as LEDs or resonant cavity photodetectors.

What is claimed is:

1. An optoelectronic device assembly comprising:
   a substrate; and
   a surface normal optoelectronic device on said substrate
      said optoelectronic device comprising a plurality of layers,
         said plurality of layers including an optically transparent, encapsulation medium matching layer, said medium matching layer having an index of refraction n1 substantially equal to an index of refraction n2 of an encapsulation medium which is to encapsulate said optoelectronic device;
         said medium matching layer having a predetermined thickness configured to adjust an optical characteristic of said optoelectronic device so as to make pre-encapsulation, on-wafer, test characterstics of said optoelectronic device substantially similar to post encapsulation functional characteristics.

2. The optoelectronic device assembly of claim 1 wherein said thickness of said medium matching layer comprises a non-quarter wavelength thickness.

3. The optoelectronic device assembly of claim 1 wherein said optoelectronic device comprises a VCSEL.

4. An encapsulated optoelectronic device assembly comprising:
   a substrate;
   surface normal optoelectronic device on said substrate
      said optoelectronic device comprising a plurality of layers; and
   an optically transmissive encapsulation medium substantially encapsulating said optoelectronic device wherein said encapsulation medium has an index of refraction n1,
      said plurality of layers of said optoelectronic device including an optically transparent, encapsulation medium matching layer, said medium matching layer having an index of refraction n2 substantially equal to said index of refraction n1 of said encapsulation medium,
      said medium matching layer having a predetermined thickness configured to adjust an optical characteristic of said optoelectronic device so as to make pre-encapsulation, on-wafer, test characteristics of said optoelectronic device substantially similar to post encapsulation functional characteristics.

5. The optoelectronic device assembly of claim 4 wherein said thickness of said medium matching layer comprises a non-quarter wavelength thickness.

6. The optoelectronic device assembly of claim 4 wherein said optoelectronic device comprises a VCSEL.

7. A VCSEL structure comprising:
   a substrate;
   a first mirror overlying said substrate;
   an active optical region overlying said first mirror;
   a second mirror overlying said active optical region; and
   an optically transparent, encapsulation medium matching layer deposited onto said VCSEL structure and overlying said second minor, said medium matching layer having an index of refraction n1 substantially equal to an index of refraction n2 of an encapsulation medium which is to encapsulate said VCSEL structure,
      said medium matching layer having a predetermined thickness configured to adjust a reflectivity of said second mirror so as to ale pre-encapsulation, on-wafer, test characteristics of said VCSEL structure substantially similar to post encapsulation functional characteristics.

8. The VCSEL structure of claim 7 wherein said thickness of said medium matching layer comprises a non-quarter wavelength thickness.

9. The VCSEL structure of claim 7 further comprising an optically transparent tuning layer lying between said second mirror and said medium matching layer, said tuning layer being configured to predictably change a top facet reflectivity of said second mirror and having a predetermined thickness configured to adjust a slope of the laser emission to within a desired range.

10. The VCSEL structure of claim 9 wherein said thickness of said tuning layer comprises a non-quarter wavelength thickness.

11. The VCSEL structure of claim 10 wherein said thickness of said medium matching layer comprises a non-quarter wavelength thickness.

12. The VCSEL structure of claim 9 wherein said thickness of said medium matching layer comprises a non-quarter wavelength thickness.

13. The VCSEL structure of claim 9 wherein said tuning layer is one of a plurality of layers of a distributed Bragg reflector lying between said second mirror and said medium matching layer.

14. The VCSEL structure of claim 13 wherein said distributed Bragg reflector comprises alternating layers of oxides and nitrides, and said tuning layer comprising a nitride layer of a predetermined non-quarter wavelength thickness.

15. An encapsulated VCSEL assembly comprising:
a VCSEL structure comprising a substrate, a first mirror overlying said substrate, an active optical region overlying said first mirror, and a second mirror, overlying said active optical region; and
an optically transmissive encapsulation medium substantially encapsulating said VCSEL structure wherein said encapsulation medium has an index of refraction n1,
said VCSEL structure further comprising an optically transparent, encapsulation medium matching layer deposited onto said VCSEL structure and overlying said second mirror, said medium matching layer having an index of refraction n2 substantially equal to said index of refraction n1 of said encapsulation medium, said medium matching layer having a predetermined thickness configured to adjust a reflectivity of said second, mirror so as to make pre-encapsulation, on-wafer, test characteristics of said VCSEL structure substantially similar to post encapsulation functional characteristics.

16. The VCSEL structure of claim 15 wherein said thickness of said medium matching layer comprises a non-quarter wavelength thickness.

17. The VCSEL structure of claim 15 further comprising an optically transparent tuning layer lying between said second mirror and said medium matching layer, said tuning layer being configured to predictably change a top facet reflectivity of said second mirror and having a predetermined thickness configured to adjust a slope of the laser emission to within a desired range.

18. The VCSEL structure of claim 17 wherein said thickness of said tuning layer comprises a non-quarter wavelength thickness.

19. The VCSEL structure of claim 18 wherein said thickness of said medium matching layer comprises a non-quarter wavelength thickness.

20. The VCSEL structure of claim 17 wherein said thickness of said medium matching layer comprise, a non-quarter wavelength thickness.

21. The VCSEL structure of claim 17 wherein said tuning layer is one of a plurality of layers of a distributed Bragg reflector lying between said second mirror and said medium matching layer.

22. The VCSEL structure of claim 21 wherein said distributed Bragg reflector comprises alternating layers of oxides and nitrides, and said tuning layer comprising a nitride layer of a predetermined non-quarter wavelength thickness.

23. A method of fabricating an encapsulated optoelectronic device having controlled characteristics, the method comprising the steps of:
fabricating an optoelectronic device;
measuring a characteristic of said optoelectronic device;
providing an encapsulation medium matching material having an index of refraction n1;
determining a thickness of said encapsulation medium matching material configured to maintain said measured characteristic substantially the same before and after encapsulation;
depositing a layer of said encapsulation medium matching material onto said optoelectronic device, said layer having said determined thickness;
providing an encapsulating material having ant index of refraction n2, which is substantially equal to n1; and
encapsulating said optoelectronic device with said encapsulation material wherein pre-encapsulation, on-wafer, test characteristics of said optoelectronic device are substantially similar to post encapsulation functional characteristics thereof.

24. The method of claim 23 wherein said optoelectronic device comprises a laser, and said step of measuring a characteristic of said optoelectronic device comprising measuring a slope efficiency of said lacer.

25. The method of claim 24 wherein said thickness of said encapsulation medium matching material is determined to maintain the slope efficiency of the laser substantially the same after encapsulation.

26. A method of fabricating an encapsulated VCSEL having a controlled slope efficiency, the method comprising the steps of:
fabricating a VCSEL structure;
measuring a slope efficiency of said VCSEL structure;
providing an encapsulation medium matching material having an index of refraction n1;
determining in conjunction with one another, a thickness of a tuning layer and a thickness of said encapsulation medium matching material configured to maintain said slope efficiency of said VCSEL structure substantially the same before and after encapsulation;
depositing said tuning layer having said determined thickness;
depositing said encapsulation medium matching material over said VCSEL structure, said medium matching material having said determined thickness;
providing an encapsulating material having an index of refraction n2, which is substantially equal to n1; and
encapsulating said optoelectronic device with said encapsulation material wherein pre-encapsulation, on-wafer, slope efficiency of said VCSEL structure is substantially similar to post encapsulation slope efficiency thereof.

27. The method of claim 26 wherein said step of depositing said tuning layer comprises depositing a plurality of layers of a distributed Bragg reflector, said tuning layer being a non-quarter wavelength layer of said Bragg reflector.

28. The method of claim 27 wherein said distributed Bragg reflector comprises alternating layers of oxides and nitrides, and said tuning layer comprises a nitride layer of a predetermined non-quarter wavelength thickness.

* * * * *